(12) United States Patent
Probst

(10) Patent No.: US 9,284,641 B2
(45) Date of Patent: Mar. 15, 2016

(54) PROCESSING DEVICE FOR PRODUCING SEMICONDUCTOR LAYERS AND COATED SUBSTRATES TREATED WITH ELEMENTAL SELENIUM AND/OR SULPHUR

(71) Applicant: Volker Probst, Berlin (DE)

(72) Inventor: Volker Probst, Berlin (DE)

(*) Notice: Subject to any disclaimer, the term of this patent is extended or adjusted under 35 U.S.C. 154(b) by 0 days.

(21) Appl. No.: 14/458,231

(22) Filed: Aug. 12, 2014

(65) Prior Publication Data

US 2014/0345529 A1    Nov. 27, 2014

Related U.S. Application Data

(62) Division of application No. 13/131,802, filed as application No. PCT/EP2009/008514 on Nov. 30, 2009, now Pat. No. 8,846,442.

(30) Foreign Application Priority Data

Nov. 28, 2008    (EP) .................................... 08020746

(51) Int. Cl.
```
C23C 16/00      (2006.01)
C23C 16/02      (2006.01)
C23C 14/58      (2006.01)
```

(52) U.S. Cl.
CPC ......... *C23C 16/0209* (2013.01); *C23C 14/5866* (2013.01)

(58) Field of Classification Search
CPC ....... H01L 31/18; H01L 21/20; C23C 16/455; C23C 16/52; B05C 11/00; B05D 5/12; B05D 5/00
USPC ............................ 118/724, 725; 438/95, 478; 257/E31.015, E21.09; 427/58, 248
See application file for complete search history.

(56) References Cited

U.S. PATENT DOCUMENTS

| | | | | |
|---|---|---|---|---|
| 4,949,783 | A | * | 8/1990 | Lakios et al. ................. 165/80.1 |
| 5,015,503 | A | * | 5/1991 | Varrin et al. ..................... 117/99 |

(Continued)

FOREIGN PATENT DOCUMENTS

| | | |
|---|---|---|
| CN | 1912178 A | 2/2007 |
| CN | 101095240 A | 12/2007 |

(Continued)

OTHER PUBLICATIONS

Kosaraju, S., et al., "Formation of Chalcogen Containing Plasmas and Their Use in the Synthesis of Photovoltaic Absorbers," Journal of Vacuum Science & Technology 23(4):1202-1207, Papers from the 51st International Symposium of AVS, Jul./Aug. 2005.

(Continued)

*Primary Examiner* — Caleb Henry
(74) *Attorney, Agent, or Firm* — Christensen O'Connor Johnson Kindness PLLC

(57) ABSTRACT

A processing device for producing semiconductor layers and coated substrates treated with elemental selenium and/or sulphur includes an evacuable processing chamber for receiving a substrate to be processed. The substrate has a metal layer and/or a layer containing metal. A heating device provides convective heating of the substrate to a predetermined temperature. A first source of elementary selenium and/or sulphur vapor is located outside the processing chamber and connected to the processing chamber via a first feed line and/or a second source of elementary selenium and/or sulphur vapor is located inside the processing chamber. The elementary selenium and/or sulphur vapor is guided past the metal layer and/or layer containing metal, chemically reacting said layer with selenium or sulphur in a targeted manner. The substrate is heated and the elementary selenium and/or sulphur vapor is mixed and guided past the substrate by forced convection of a gas conveying device.

17 Claims, 9 Drawing Sheets

(56) References Cited

U.S. PATENT DOCUMENTS

| | | | |
|---|---|---|---|
| 5,480,678 A * | 1/1996 | Rudolph et al. | 427/248.1 |
| 5,728,231 A * | 3/1998 | Negami et al. | 148/33 |
| 5,855,680 A * | 1/1999 | Soininen et al. | 118/719 |
| 5,935,324 A | 8/1999 | Nakagawa | |
| 6,086,362 A * | 7/2000 | White et al. | 432/243 |
| 6,193,507 B1 * | 2/2001 | White et al. | 432/247 |
| 6,281,036 B1 * | 8/2001 | Niki et al. | 438/95 |
| 6,350,964 B1 * | 2/2002 | Boas et al. | 219/390 |
| 6,585,823 B1 * | 7/2003 | Van Wijck | 117/89 |
| 6,703,589 B1 * | 3/2004 | Probst | 219/390 |
| 6,717,112 B1 * | 4/2004 | Probst | 219/390 |
| 6,797,336 B2 * | 9/2004 | Garvey et al. | 427/561 |
| 6,884,968 B2 * | 4/2005 | Probst | 219/390 |
| 6,949,202 B1 | 9/2005 | Patel | |
| 7,105,441 B2 * | 9/2006 | Derderian et al. | 438/680 |
| 7,204,885 B2 * | 4/2007 | Derderian et al. | 118/667 |
| 7,238,241 B2 * | 7/2007 | Goela et al. | 118/728 |
| 7,282,158 B2 * | 10/2007 | Burgess et al. | 216/37 |
| 7,442,413 B2 * | 10/2008 | Zwaap et al. | 427/248.1 |
| 7,793,611 B2 * | 9/2010 | Oladeji | 118/667 |
| 8,053,274 B2 * | 11/2011 | Wieting | 438/102 |
| 8,318,531 B2 * | 11/2012 | Wieting | 438/95 |
| 8,349,127 B2 * | 1/2013 | Tandou et al. | 156/345.47 |
| 2001/0031541 A1 | 10/2001 | Madan | |
| 2002/0195439 A1 | 12/2002 | Moller | |
| 2004/0099216 A1 | 5/2004 | Koh | |
| 2004/0149384 A1 | 8/2004 | Kanno | |
| 2005/0194036 A1 * | 9/2005 | Basol | 136/252 |
| 2007/0116892 A1 * | 5/2007 | Zwaap et al. | 427/587 |
| 2007/0116893 A1 * | 5/2007 | Zwaap et al. | 427/587 |
| 2007/0119373 A1 | 5/2007 | Kumar | |
| 2007/0187386 A1 * | 8/2007 | Kim et al. | 219/385 |
| 2007/0289624 A1 | 12/2007 | Kuriyagawa | |
| 2008/0035199 A1 * | 2/2008 | Kume et al. | 136/264 |
| 2008/0053614 A1 | 3/2008 | Sago | |
| 2008/0105204 A1 | 5/2008 | Nakada | |
| 2008/0105650 A1 * | 5/2008 | Sugai et al. | 216/69 |
| 2008/0110495 A1 | 5/2008 | Onodera | |
| 2008/0199612 A1 | 8/2008 | Keevers | |
| 2008/0210290 A1 * | 9/2008 | Wu et al. | 136/244 |
| 2008/0210295 A1 | 9/2008 | Basol | |
| 2008/0305247 A1 | 12/2008 | Von Klopmann | |
| 2009/0017207 A1 * | 1/2009 | Eser et al. | 427/251 |
| 2010/0311202 A1 * | 12/2010 | Hakuma et al. | 438/95 |
| 2011/0183461 A1 * | 7/2011 | Probst | 438/95 |
| 2011/0229989 A1 * | 9/2011 | Wieting | 438/14 |
| 2011/0269089 A1 | 11/2011 | Echizenya | |
| 2014/0345529 A1 * | 11/2014 | Probst, Volker | 118/725 |

FOREIGN PATENT DOCUMENTS

| | | |
|---|---|---|
| DE | 197 17 565 A1 | 11/1997 |
| DE | 10 2004 024 601 A1 | 12/2005 |
| EP | 1 833 097 A1 | 12/2007 |
| EP | 1 643 199 B1 | 5/2010 |
| GB | 1 419 308 A | 12/1975 |
| JP | 62-131188 A | 6/1985 |
| JP | 05-157461 A | 6/1993 |
| JP | 10-197166 A | 7/1998 |
| JP | 2006-186114 A | 7/2006 |
| WO | 2006/128247 A1 | 12/2006 |
| WO | 2007/053016 A2 | 5/2007 |
| WO | 2007/077171 A2 | 7/2007 |

OTHER PUBLICATIONS

Lakshmikumar, S.T., and A.C. Rastogi, "Selenization of Cu and In Thin Films for the Preparation of Selenide Photo-Absorber Layers in Solar Cells Using Se Vapour Source," Solar Energy Materials and Solar Cells 32(1):7-19, Jan. 1994.

European Search Report mailed Oct. 13, 2009, in European Patent Application No. 08 02 0746.7, filed Nov. 28, 2008, 2 pages.

International Search Report mailed Mar. 18, 2010, in International Patent Application No. PCT/EP2009/008514, filed Nov. 30, 2009, 2 pages.

Australian Office Action dated Jun. 25, 2013, in Australian Patent Application No. 2009259641, filed Dec. 23, 2009, 6 pages.

European Search Report mailed Oct. 9, 2008, in corresponding European Application No. 08011247.7, filed Jun. 20, 2008, 2 pages.

International Search Report mailed Aug. 24, 2009, in corresponding International Application No. PCT/EP2009/004459, filed Jun. 19, 2009, 2 pages.

Sebastian, P.J., et al., "CuInS$_2$ Based Solar Cell Structures by CVTG," Applied Energy 52(2-3):199-207, 1995.

Yan, Y.-H., et al., "Characterization of CuInS$_2$ Thin Films Prepared by Sulfurization of Cu—In Precursor," Transactions of Nonferrous Metals Society of China 18(5):1083-1088, Oct. 2008.

* cited by examiner

PROCESSING DEVICE FOR PRODUCING SEMICONDUCTOR LAYERS AND COATED SUBSTRATES TREATED WITH ELEMENTAL SELENIUM AND/OR SULPHUR

CROSS-REFERENCE TO RELATED APPLICATION

This application is a divisional of U.S. patent application Ser. No. 13/131,802, filed Oct. 4, 2011, the disclosure of which is incorporated herein in its entirety.

BACKGROUND

The present disclosure relates to a method for producing semiconductor layers and coated substrates treated with elemental selenium and/or sulphur, in particular flat substrates, containing at least one conducting, semiconducting, and/or insulating layer, in which a substrate that is provided with at least one metal layer and/or with at least one layer containing metal, in particular a stack of substrates, each of which is provided with at least one metal layer and/or with at least one layer that contains metal, is inserted into a processing chamber and heated to a predetermined substrate temperature.

SUMMARY

A method of this type is known in general and is used, for example, in the solar cell industry in the production of CIS solar cells. In particular, a known method of this type for producing I-III-VI connection semiconductor layers, the chalcopyrite semiconductor layers, is used. For this purpose, for example, substrates comprising a molybdenum thin layer, such as glass substrates, are respectively provided with a precursor thin metal layer comprising copper, gallium, and indium, and then heated in the processing chamber according to a predetermined temperature profile while being subjected to a feed of $H_2Se$ and $H_2S$. In one variant, substrates comprising a molybdenum thin layer are respectively provided with a precursor thin metal layer comprising copper, gallium, indium, and selenium, and then heated in the processing chamber according to a predetermined temperature profile while being subjected to a feed of $H_2S$. Due to a reaction of the precursor metal layers with the selenium containing $H_2Se$ and the sulphur contained in the $H_2S$, $Cu(In,Ga)(Se,S)_2$ semiconductor layers, or chalcopyrite semiconductor layers, are formed on the substrates. This process is also known as selenization or sulphurization.

The use of $H_2Se$ and $H_2S$ is problematic in the sense that $H_2Se$ and $H_2S$ are not only expensive to procure, but are also toxic and highly explosive gases. These gases are therefore a significant economic factor in the mass production of CIS solar cells, not only due to their procurement costs, but also as a result of the increased safety measures and the costs entailed in disposing of the related discharge gases. This aside, due to their toxicity and explosivity, the safety risk presented by these gases for production staff should not be underestimated, even when preventive measures are taken.

An object of the present disclosure is to provide a safer and more economic method for producing a semiconductor layer, in particular, a chalcopyrite semiconductor layer, or a buffer layer on a semiconductor layer.

Disclosed herein is a method for producing semiconductor layers and coated substrates treated with elemental selenium and/or sulphur, in particular, flat substrates, containing at least one conducting, semiconducting, and/or insulating layer, in which a substrate that is provided with at least one metal layer and/or with at least one layer containing metal, in particular, a stack of substrates, each of which is provided with at least one metal layer and/or with at least one layer that contains metal, is inserted into a processing chamber and heated to a predetermined substrate temperature;

elementary selenium and/or sulphur vapor is guided past the metal layer(s) and/or layer(s) containing metal, from a source located inside and/or outside the processing chamber (internal or external source), in particular, by means of a carrier gas that is, in particular, inert, under rough vacuum conditions or ambient pressure conditions or overpressure conditions, in order to react chemically with said layer with selenium or sulphur in a targeted manner;

the substrate is heated by means of forced convection by at least one gas conveying device and/or the elementary selenium and/or sulphur vapor is mixed and guided past on the substrate by means of forced convection by at least one gas conveying device in the processing chamber, in particular, in a homogeneous manner.

In the spirit of the present disclosure, the metal layer and/or layer containing metal to be treated with selenium and/or sulphur are also referred to below as the precursor layer. The metal layer contains, in particular, one element or several elements selected from aluminium, silver, zinc, magnesium, molybdenum, copper, gallium, and indium, wherein copper, gallium, and/or indium are preferred.

In the spirit of the present disclosure, the layer that contains metal comprises (i) at least one metal, e.g., In, Zn, and/or Mg, and a nonmetallic element of the periodic table of elements, in particular, sulphur and/or selenium, and if appropriate, chlorine, oxygen, or hydrogen, and/or (ii) at least one chemical compound of a metal, e.g., In, Zn, and/or Mg, with a nonmetallic element of the periodic table of elements, in particular, sulphur and/or selenium, and if appropriate, chlorine, oxygen, or hydrogen. The layer containing metal thus also comprises those embodiments in which, alongside at least one metal, at least one chemical compound of a metal and/or a nonmetallic element are also present. Furthermore, the layer containing metal also comprises in the spirit of the present disclosure those layers in which no pure metal is present, but solely at least one chemical compound of a metal, if appropriate together with nonmetallic elements and/or compounds.

With the method according to the present disclosure, at least one substrate that is provided with a precursor layer and, in particular, a stack of substrates that are in each case provided with a precursor layer is inserted into a processing chamber and heated to a predetermined substrate temperature. The method according to the present disclosure is characterized by the fact that elementary selenium and/or sulphur vapor is guided past from a first or second source located inside and/or outside the processing chamber by means of a carrier gas, which is, in particular, inert under rough vacuum conditions, to overpressure conditions on the or on each precursor layer, in order for said layer to react chemically in a targeted manner with selenium or sulphur. In this context, process conditions are designated as rough vacuum conditions in which processing pressures ranging from ambient pressure to 1 mbar are present. However, the method according to the present disclosure and the device according to the present disclosure can in general also be used with overpressure.

According to the present disclosure, the selenium required to react with the precursor layer or the sulphur required to react with the precursor layer is thus not provided by $H_2Se$ or $H_2S$ gas, but by elementary selenium or sulphur vapor, i.e., vapor containing elementary selenium or vapor containing elementary sulphur. Therefore, according to the present disclosure, the use of $H_2Se$ and $H_2S$ is not required. The method according to the present disclosure can nevertheless permit the use of $H_2Se$ and/or $H_2S$, during or after the selenization stage with elementary selenium vapor or before, during or after the sulphurization stage with elementary sulphur vapor. In particular, in one embodiment of the method according to the present disclosure, $H_2Se$ and/or $H_2S$ can be added before and/or during the selenization stage with elementary selenium, in particular, at temperatures ranging from room temperature to 350° C., preferably at temperatures ranging from 100° C. to 300° C.

In contrast to $H_2Se$ and $H_2S$, elementary selenium vapor and elementary sulphur vapor are neither highly toxic nor explosive, and are thus significantly less hazardous to handle, so that no complex and costly safety measures are required. Furthermore, elementary selenium vapor and elementary sulphur vapor are easy to obtain, e.g., from a melted selenium or sulphur mass. As a result, the method according to the present disclosure can be conducted at a significantly lower economic cost and with a far higher degree of safety.

Advantageous embodiments of the method are described in the subclaims, the description, and the drawings.

In one embodiment, it is provided that the gas conveying device is an injection nozzle or a ventilator. Furthermore, it can be provided that the gas conveying device, in particular, the ventilator, is preferably arranged in the area of one of the front sides of the processing goods stack, and/or is affixed to a drive shaft that extends into the processing chamber.

In order to attain the required vapor pressure of the selenium or sulphur vapor, in particular, the first source is preferably maintained at an increased source temperature. Here, the source temperature is preferably lower than the temperature in the processing chamber, and, in particular, lower than a minimum substrate temperature at any point in time during the guiding past of the elementary selenium and/or sulphur vapor on the substrate. As a result, it applies for every substrate temperature in the processing chamber that the partial pressure of the selenium or sulphur is lower than the vapor pressure of the selenium or sulphur with the respective substrate temperature. Thus, a condensation of the selenium or sulphur vapor on the substrate is avoided, which is an important requirement for a homogeneous reaction to a semiconductor layer. Condensation of selenium vapor on the substrate, for example, would lead to drying of the selenium and thus result in a lateral, inhomogeneous layer thickness distribution of the selenium and a lateral, inhomogeneous reaction procedure.

According to the present disclosure, the substrate is heated using forced convection and/or the selenium or sulphur vapor is guided past on the substrate by means of forced convection. When the substrate is heated by means of forced convection, the temperature distribution is particularly homogeneous across the substrate. In other words, temperature fluctuations are minimized across the substrate.

When elementary selenium or sulphur vapor is guided past on the substrate by means of forced convection, a particularly homogeneous progress of the reaction of the selenium or sulphur with the precursor layer is achieved across the surface of the substrate.

According to a further embodiment, a feed line through which the elementary selenium or sulphur vapor is guided on the route from the first source to the substrate, and/or a wall that defines the processing chamber is maintained at a temperature that is equal to or greater than the source temperature. This ensures that the selenium or sulphur vapor does not condense on the feed line or on the processing chamber wall, but solely reacts chemically in a targeted manner with the precursor layer located on the substrate.

A bubbler comprising fluid selenium or fluid sulphur through which the carrier gas is guided can be used as a source, or a crucible filled with fluid selenium or sulphur can be used, which comprises a side that enables the selenium or sulphur to evaporate, and on which the carrier gas is guided past. A source of this type is not only characterized by a simple and cost-effective structure, but can also be integrated into already existing processing plants, so that existing processing plants can be upgraded in a simple manner in order to implement the method according to the present disclosure. Sources of this type can be located both inside the processing chamber and outside the processing chamber. Suitable sources in the spirit of the present disclosure also take the form of elementary selenium and/or elementary sulphur inserted in solid form into the processing chamber, for example, in the form of pellets or powder. In this case, a feed line or feed device is required in the processing chamber, with which the elementary selenium that is provided in solid form or the elementary sulphur that is provided in solid form can be transferred, preferably under inert conditions such as with protective gas (argon, nitrogen, etc.); for example, into one or more crucibles that are attached in the processing chamber. These crucibles are preferably heatable in a controlled manner, and it is preferably possible that protection gas from a controllable flow and a controllable temperature can flow through or against them, so that the vaporization rate can be influenced in a targeted manner, and by measuring the selenium or sulphur partial pressure, said pressure can be precisely controlled and adjusted in the processing chamber. Accordingly, it can be provided that selenium and/or sulphur is inserted in solid form via a transfer device into the processing chamber, wherein said transfer device can take the form of a second feed line or a sluice chamber. Here, a procedure is advantageous in which pre-heated carrier gas is fed via the second and/or at least one third feed line to the internal selenium and/or sulphur source.

In one embodiment, accordingly the solid selenium and/or the solid sulphur is or are converted into the vapor phase by means of the heating device located in the processing chamber, with the aid of the forced convection. In a further embodiment, an exchangeable crucible, known as a shuttle, is fed outside the processing chamber with the elementary selenium that is provided in solid form or with the elementary sulphur that is provided in solid form, and is transferred to the processing chamber, preferably under inert conditions, for example, under protective gas (argon, nitrogen, etc.), e.g., with the aid of the forenamed transfer device or sluice chamber. These crucibles are also preferably heatable in a controlled manner, and it is preferably possible that protection gas from a controllable flow and a controllable temperature can flow through or against them, so that the vaporization rate can be influenced in a targeted manner, and by measuring the selenium or sulphur partial pressure, said pressure can be precisely controlled and adjusted in the processing chamber. Advantageously, the chemical reaction of the selenium and/or the sulphur with the precursor layer, i.e., the selenization or sulphurization, is conducted with a pressure in the processing chamber ranging from approximately 1 mbar to approximately 1,030 mbar. These processing pressures are, on the one hand, so low that the process gases, in particular, the selenium vapor or sulphur vapor, cannot escape from the processing chamber. At the same time, these process pressures are so high, however, that these processes are not high or fine vacuum processes in the real sense. Thus, lower requirements are necessary for the vacuum technology and, in particular, the pump capacity of existing pumps, as a result of which the method overall can be implemented even more cost-effectively.

Both the selenium and the sulphur vapor pressure can lie within a range of 1e-7 mbar and 1,000 mbar, depending on the processing temperature. Typically, the selenium or sulphur partial pressure lies within a range of approximately 0.001 mbar and approximately 100 mbar.

According to a special embodiment of the method according to the present disclosure that is particularly suitable for producing a I-III-VI connection semiconductor layer and chalcopyrite semiconductor layer, the method comprises the following stages:

Increase of the substrate temperature with a heating rate of approximately 5° C./min to 600° C./min, preferably 10° C./min to 60° C./10 mins, from a first temperature, in particular room temperature, to a temperature ranging from approximately 400° C. to 600° C., preferably 400° C. to 500° C.;

Feeding of elementary selenium vapor into the processing chamber from a substrate temperature ranging from 100° C. to 350° C., in particular between 120° C. and 300° C., if appropriate, followed by the feeding of elementary sulphur vapor into the processing chamber, and here, if appropriate, the subsequent adjustment of the selenium source temperature to a required partial pressure, preferably between 0.001 mbar and 100 mbar;

Maintenance of the substrate temperature in a range from 400° C. to 600° C. for 1 min to 120 mins, preferably for 10 mins to 30 mins;

While maintaining the substrate temperature in a range from 400° C. to 600° C., shutdown of the feed of elementary selenium vapor, and if appropriate, of sulphur vapor into the processing chamber after a first predetermined time period, in particular after a time period of between 1 min and 120 mins, preferably between 1 min and 60 mins;

At least a one-time pumping out and/or rinsing of the processing chamber, in particular, with at least one inert gas;

Feeding of elementary sulphur vapor into the processing chamber;

Continued increase of the substrate temperature with a heating rate of approximately 50° C./min to 600° C./min, preferably 10° C./min to 60° C./min, to a temperature ranging from approximately 450° C. to 650° C., preferably 500° C. to 550° C., and during this procedure, if appropriate, an adjustment of the sulphur source temperature to a required partial pressure, preferably between 0.001 mbar and 100 mbar;

Maintenance of the substrate temperature in a range from 450° C. to 650° C. for 1 min to 120 mins, preferably for 1 min to 60 mins, and particularly preferably for 10 mins to 30 mins;

While maintaining the substrate temperature in a range from 450° C. to 650° C., shutdown of the feed of elementary sulphur vapor into the processing chamber after a second predetermined time period, in particular, after a time period of between 1 min and 120 mins, preferably between 1 min and 60 mins;

Cooling of the substrate; and

Pumping out and/or rinsing of the processing chamber, in particular, with at least one inert gas.

Furthermore, it can be provided that in a first stage, elementary selenium vapor is guided past the precursor layer(s) (selenization stage), and that in a subsequent stage, elementary sulphur is guided past the precursor layer(s) (sulphurization stage).

Advantageously, already during the selenization stage, e.g., from a substrate temperature of between 120° C. and 600° C., elementary sulphur vapor is fed into the processing chamber, in particular in such a manner that a partial pressure ratio of selenium to sulphur is created between 0 and 0.9, or preferably of sulphur to selenium ranging from above 0 to 0.9, preferably between 0.1 and 0.3.

Furthermore, in one embodiment with the method according to the present disclosure, coated, in particular, planar substrates, in particular, pre-coated glass substrates, can be used for the production of semiconductor layers, preferably chalcopyrite semiconductor layers, preferably I-III-VI connection semiconductor layers, and, in particular, Cu(In, Ga)(Se,S)$_2$ semiconductor layers, for example, for solar cells.

Although to date, the method according to the present disclosure has been described primarily in connection with the selenization or sulphurization of a precursor layer for the production of a chalcopyrite semiconductor layer, it should be noted that the method according to the present disclosure is also suitable for the production of other semiconductor layers. Thus, the semiconductor layer to be produced can also be a buffer layer, for example, an In$_2$S$_3$ layer or a layer comprising a phase mixture of indium sulphides and indium selenides, e.g., In(S,Se)$_3$. In these cases, the precursor layer would comprise indium and/or a compound of indium and one or more elements, selected from oxygen and/or chlorine, and, in particular, sulphur and/or selenium. This precursor layer can, for example, be obtained using thin layer separation methods and PVD methods known to persons skilled in the art, such as cathode sputtering, evaporating, or CVD methods. Specifically, a thin layer for indium or an indium-sulphur compound can be separated on a I-II-V semiconductor layer formed on molybdenum, in order that during sulphurization, an In$_2$S$_3$ semiconductor buffer layer, or during sulphurization and selenization, in this order or in reverse order or simultaneously, an In$_2$(S,Se)$_3$ layer is formed on the I-III-V semiconductor. Accordingly, however, it is also possible that the precursor layer contains one or more elements, selected from In, Zn, or Mg, as a result of which accordingly ZnS or MgS layers or mixed forms can be formed, for example, which can, for example, contain indium sulphide and zinc sulphide.

When producing a buffer layer that lies on a I-III-V semiconductor layer with the method according to the present disclosure, substrate temperatures should regularly be selected that lie below those used during the formation of I-III-V semiconductor layers in accordance with the method according to the present disclosure. As a result, an unwanted modification of the surface of the I-III-V semiconductor layer can be avoided. Preferably, the substrate temperatures are here limited to levels lower than or equal to 350° C., preferably to lower than or equal to 250° C. Furthermore, it is preferred when, for the production of the buffer layer, temperatures greater than 150° C., preferably greater than or equal to 160° C., are selected.

It generally applies to selenium and sulphur source temperatures that these are preferably maintained lower than or equal to the substrate temperature during each phase of the method. In this case, the maximum achievable vapor pressures with the corresponding maximum process temperatures can be taken from the sulphur and selenium vapor pressure curves.

Depending on the process implementation or the semiconductor layer to be produced, it can here be advantageous when at least one reactive gas, such as hydrogen, $H_2Se$ or $H_2S$ in particular, is furthermore added.

A further object of the present disclosure is a processing device for implementing the method according to the present disclosure, comprising an evacuable processing chamber for receiving at least one substrate to be processed, in particular, a stack of substrates to be processed, a heating device for the, in particular, convective heating of the substrate to be processed, a first source for elementary selenium and/or sulphur vapor located outside the processing chamber, and that is connected to the processing chamber via a first feed line and/or a second source for elementary selenium and/or sulphur vapor located inside the processing chamber, and a gas conveying device for generating a gas flow circuit, in particular, by means of forced convection in the processing chamber.

The processing device according to the present disclosure comprises in an embodiment as a gas conveying device an injection nozzle or a ventilator. Here, it can preferably be provided that the gas conveying device, in particular, at least one ventilator, is arranged or arrangeable in the area of one of the front sides of the substrate stack.

The processing device according to the present disclosure is in one preferred embodiment furthermore equipped with at least one tempering device, in order to maintain at a predetermined temperature at least one partial section of a wall, which defines the processing chamber, in particular, the entire wall, and if appropriate, at least one section of the feed line respectively.

The processing device, according to the present disclosure, comprises an evacuable processing chamber for receiving at least one substrate to be processed, and, in particular, a stack of substrates to be processed, a heating device for the, in particular, convective heating of the substrate to be processed, a first source for elementary selenium and/or sulphur vapor that is located outside the processing chamber and that is connected to the processing chamber via a feed line, and/or a second source for selenium and/or sulphur vapor located inside the processing chamber, if appropriate, a tempering device, in order to maintain at a predetermined temperature at least a partial section of a wall that defines the processing chamber and at least one section of the feed line respectively, and at least one gas conveying device in order to achieve enforced convection.

Due to the tempering device, the processing chamber wall and the feed line can be maintained at a temperature at which the material of the processing chamber wall or the feed line does not corrode under the influence of the processing gas atmosphere. For example, it is known that a corrosive attack increases significantly with the temperature, and at temperatures in the range below 250° C., stainless steel hardly corrodes at all in a noticeable manner in a processing gas atmosphere containing selenium or sulphur. Due to the known vapor pressure curves for selenium and sulphur, it cannot be anticipated that selenium or sulphur condenses under the processing conditions on the tempered and thermally insulated walls of the processing chamber. Due to the tempering, the processing chamber is to be classified in terms of type as a heating wall reactor, which is stable in the long term and that emits no particles that damage the process. Furthermore, due to the tempering it is ensured that the process can be controlled very well, since in general, components of the processing gas that are in vapor or gas form and, in particular, selenium or sulphur, are neither condensed out in an uncontrollable manner during the processing sequence, nor are they fed back into the process in an uncontrollable manner.

The processing chamber can be formed from a metallic material. This means that the processing chamber can produce not only at the same processing capacity, but, above all, also with a larger chamber volume at a lower cost than a quartz tube, for example. While quartz tube diffusion ovens can only be produced with a diameter of up to 80 cm, a processing chamber formed from a metallic material can be comparatively easily adapted to larger processing goods formats, i.e., substrate surfaces, by increasing the height and width accordingly.

Advantageously, on the inner side of the processing chamber wall, a thermal insulation material is provided preferably maintains a consistent reaction under processing conditions. On the one hand, the insulation material forms an additional protection for the processing chamber wall, e.g., against corrosion, and on the other, achieves a certain thermal decoupling of the processing chamber wall from the gas atmosphere in the processing chamber so that the temperature of the gas atmosphere can be regulated more precisely. The thermal decoupling is essentially based on the lower specific heat capacity, the lower thermal conductivity and the emissivity, which in some cases is also lower, as is typical for insulation materials. Additionally, the thermal insulation material prevents the processing chamber wall from being heated above the predetermined temperature by the hot processing gas, or the heat discharge from becoming too great. The thermal insulation material is particularly advantageous with forced convection by the gas conveying device, since in this manner, the heat discharge is significantly contained due to an otherwise good heat transfer.

The insulation material can, for example, be a ceramic, a glass ceramic, graphite, including graphite foam or fibre, e.g., Carbon Fibre Enforced Carbon (CFC) or graphite felt, or an insulation material containing ceramic fibres, e.g., consisting of $SiO_2$ and $Al_2O_3$ fibres.

According to one embodiment of the processing device, the source comprises a heatable and evacuable source chamber, in which a crucible is arranged and filled with melted selenium or sulphur mass, and a line for, in particular, preheated carrier gas, in such a manner that the carrier gas is either guided through according to the bubbler principle through the melted selenium or sulphur mass, or is guided away over a surface of the melted selenium or sulphur mass. The heatable crucible and the heatable line preferably comprise a material that remains stable in selenium or sulphur, and are formed, e.g., of ceramic, quartz, or corrosion-resistant special alloys.

In the processing chamber of the device according to the present disclosure, a gas conveying device is furthermore provided to generate a gas flow circuit in the processing chamber. The gas conveying device preferably comprises at least one ventilator. The ventilator can be an axial or radial fan, for example.

The ventilator can comprise a material that remains stable, and can be attached to a drive shaft that extends into the processing chamber and that preferably also comprises a material that remains stable. Due to the use of the material that remains stable, the ventilator and/or the drive shaft are protected against attack by reactive components of the processing gas, and, in particular, are protected against corrosion.

Advantageously, the ventilator is arranged in the area of one of the front sides of the substrate stack. This arrangement of the ventilators contributes towards a particularly homogeneous through flow of a substrate stack with processing gas, and thus to a particularly homogeneous deposition of the layers and layer reaction.

In order to further increase the flow speed and the homogeneity of the gas flow, an additional ventilator is advantageously arranged in the area of the other front side of the substrate stack. With this arrangement of two ventilators, preferably the one ventilator is designed in such a manner that it conveys the processing gas into the substrate stack, while the other ventilator conveys the processing gas out of the substrate stack. In other words, the one ventilator operates in "impulse mode," while the other operates in suction mode.

The ventilator or drive shaft material, which remains stable, can, for example, be a ceramic material such as silicon nitride or silicon carbide.

Preferably, the drive of the ventilator, or the drives of the ventilators, can also operate in the inverse direction of rotation, so that the gas flow circuit can be reversed. As an option, radial ventilators can be attached to both sides of the substrate stack, with which the gas flow direction can be reversed by switching on the previously shut down ventilator, and shutting down the ventilator that was previously switched on.

According to yet another embodiment, the heating device is arranged in the gas flow circuit generated by the gas conveying device, in order to heat up a gas located in the processing chamber, in particular, the carrier gas that is displaced by the elementary selenium or sulphur vapor. In other words, the heating device is arranged inside the processing chamber so that a heat source located outside the processing chamber, such as an infrared radiation source, is no longer required in order to heat the processing gas. Thus, it is not necessary to optimize the processing chamber with regard to infrared radiation, rendering the structure of the processing significantly more simple, as well as enabling the use of a metallic material to produce the processing chamber.

The heating device can comprise at least one corrosion-resistant heating element. In particular, the heating device can be designed as a plate stack of resistance heating elements. For example, graphite or silicon carbide heating elements can be used here as plate-type meander heaters or as heating rods. Depending on the design of the gas flow speed, the heating capacity, and the surface of the heating matrix, heating rates of the goods to be processed can be achieved ranging from several degrees Celsius per minute to several degrees Celsius per second.

According to yet another embodiment, a cooling device is arranged in the gas flow circuit generated by the gas conveying device in order to cool down a gas located in the processing chamber, in particular, the carrier gas that is displaced by the elementary selenium or sulphur vapor.

The cooling device can comprise at least one cooling element and, in particular, a plate stack cooler or tube bundle cooler. The cooling element can, for example, be maintained at a temperature of, e.g., approximately 200° C. by means of an oil tempering device. Depending on the gas flow speed, the cooler capacity, and the surface of the cooler arrangement, cooling rates can be achieved on the goods to be processed of up to several degrees Celsius, in particular, up to several tens of degrees Celsius per minute.

According to yet another embodiment, gas diversion elements are provided, via which the gas flow circuit can be diverted in such a manner that either the heating device or a cooling device is arranged in the gas flow circuit. When set accordingly, the gas diversion elements enable a particularly rapid heating or cooling of the goods to be processed to a required temperature, and thus ultimately enable the realization of almost any temperature profiles required in the processing chamber.

In addition to the gas conveying device, the processing device can comprise a gas guidance device, which retains a substrate staple, and that is arranged in the processing chamber in such a manner that at least one part of the gas flow circuit generated runs through the gas guidance device. The gas conveying device and the gas guidance device provide on the one hand a particularly homogeneous heating and cooling of the substrate stack via forced convection, and on the other, provide a particularly homogeneous gas distribution and, as a result, ultimately a particularly homogeneous layer formation, e.g., of a chalcopyrite semiconductor, on the substrates.

The combination of the gas conveying device, the gas guidance device, and the heating device enables an increase in heating and cooling speed, as a result of which shorter processing times and thus a higher throughput of goods to be processed are possible.

The gas guidance device can comprise at least one upper separation plate, which defines a first chamber area in the processing chamber above the gas guidance device that retains the substrate stack, and a lower separation plate, which defines a second chamber area in the processing chamber below the gas guidance device that retains the substrate stack. Additionally, the gas guidance device can also comprise two side separation plates.

Preferably, the gas guidance device comprises at least one distribution device for the even surface distribution of the gas flow, wherein the substrate stack is preferably arranged upstream of the distribution device. The distribution device can, for example, be a plate that is equipped with slits and/or holes. The distribution device and the gas guidance device preferably consist of a material that remains stable, e.g., a glass ceramic, silicon carbide, quartz, or silicon nitride. In a similar manner to the processing chamber wall, the surfaces of the gas guidance device can also be equipped with a thermal insulation material that is preferably stable under processing conditions. In this manner, the gas guidance device is also at least, to a large extent, thermally decoupled from the gas atmosphere in the processing chamber so that the processing device, in particular, in the dynamic case of a set temperature change, comprises a lower thermal mass overall, as a result of which the temperature of the processing gas in the processing chamber can be regulated even faster and more precisely. Due to its stability against reactive components of the processing gas, the insulation material also forms an additional protection for the gas guidance device, e.g., against corrosion.

In one embodiment of the device according to the present disclosure, it is provided that the first source comprises a heatable and evacuable source chamber in which a crucible filled with melted selenium or sulphur mass is arranged or arrangeable, and a line for in particular pre-heated carrier gas in such a manner that the carrier gas is either guided through or can be guided through the melted selenium or sulphur mass according to the bubbler principle, or is guided away from or can be guided away from the melted selenium or sulphur mass, wherein the crucible and the line preferably comprise material that remains stable in selenium or sulphur, and, in particular, are formed from ceramic, quartz, or corrosion-resistant special alloys or metals with corrosion-resistant coatings.

Furthermore, it can be provided that the heating device is arranged or arrangeable in the gas flow circuit generated by the gas conveying device in order to heat a gas located in the processing chamber; and/or a cooling device for cooling down a gas located in the processing chamber is arranged or arrangeable in the gas flow circuit generated by the gas conveying device; and/or gas diversion elements are provided through which the gas flow circuit can be diverted in such a manner that either the heating device or a cooling device is arranged or arrangeable in the gas flow circuit.

In a preferred embodiment, devices according to the present disclosure can furthermore be characterized by at least one device for the transfer into the processing chamber of solid selenium and/or solid sulphur that are, in particular, dosed in advance. Here, it can be provided that the transfer device comprises a second feed line and/or a sluice chamber, in particular, containing a retaining device for solid selenium or solid sulphur.

A further object of the present disclosure is additionally a processing plant for processing stacked substrates with at least one processing device, wherein the processing device comprises a loading opening, through which the substrate stack can be inserted into the processing chamber, and a discharge opening, through which the substrate stack can be removed from the processing chamber.

Advantageously, the processing plant comprises a further processing device that is arranged adjacent relative to the one processing device, and comprises a loading opening that is aligned with the discharge opening of the one processing device. The loading opening and/or the discharge opening can here be closed by a door, in particular, a plate valve.

Preferably, the additional processing device is a cooling device that comprises a cooling facility, and that is arranged in a gas flow circuit that is generated by a gas conveying device in an evacuable processing chamber of the cooling device. Additionally, the processing plant can comprise a sluice chamber that is upstream of the first processing device in terms of the through-flow direction, with or without convective pre-heating.

Due to the adjacent arrangement of several processing devices, the processing plant forms a through-flow plant for the stack of goods to be processed. To a certain extent, it is therefore a batch inline plan that combines the advantages of continuous through-flow operation with those of batch operation.

It is a matter of course that the number of processing devices is not limited to two. To a far greater extent, the processing plant can, for example, comprise a number n of processing devices and a number m of cooling devices, wherein n and m are natural numbers, and wherein for the simplest variant, only a batch-inline combination processing plant n=m=1 applies.

DESCRIPTION OF THE DRAWINGS

The invention will now be described below in purely exemplary form with reference to an advantageous embodiment and with reference to the appended drawings, in which.

DETAILED DESCRIPTION

Figure 1:
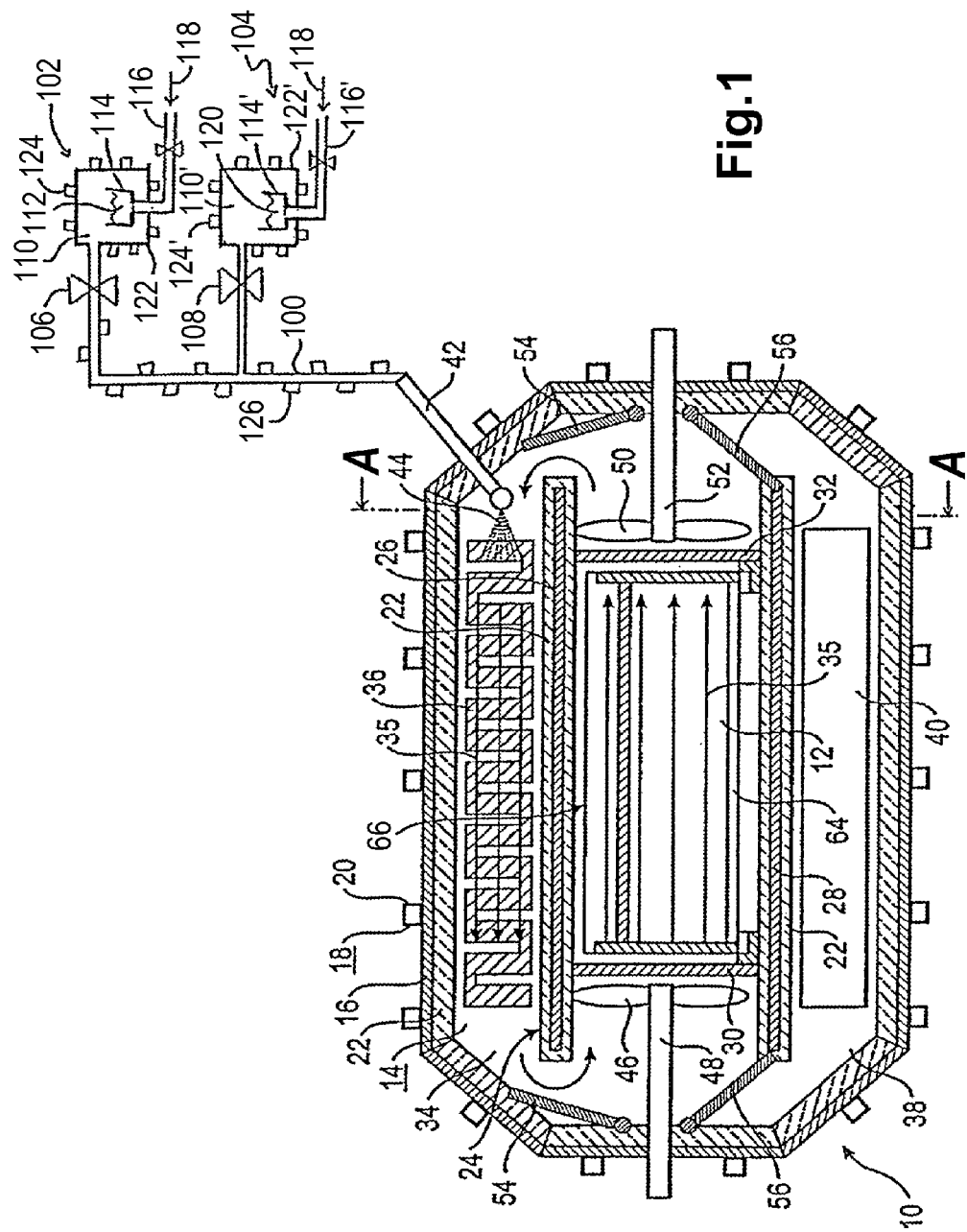
FIG. 1 shows a schematic view of a processing device according to the present disclosure.

FIG. 1 shows a processing device 10 according to the present disclosure that is provided for the formation of $Cu(In, Ga)(Se, S)_2$ semiconductor layers on substrates 12 that are to be used for the production of solar cells.

The processing device 10 comprises an evacuable processing chamber 14 that is limited by a processing chamber wall 16. The processing chamber wall 16 is formed from stainless steel and is maintained by a tempering device 18 at a temperature ranging from 150° C. to 250° C.

In the present exemplary embodiment, the tempering device 18 is formed by tube lines 20 that are attached to the outer side of the processing chamber 14, and, in particular, are welded to the processing chamber wall 16 and which encircle the processing chamber 14 in a meander form, through which a suitable hot oil flows. As an alternative or additionally, the hot oil can, however, also flow through channels (not shown) that are accordingly embedded into the processing wall 16. Additionally, the outer side of the processing chamber wall 16 can be equipped with a thermally insulating material.

On an inner side of the processing chamber wall 16, the processing chamber 14 is at least approximately completely cladded with a corrosion-resistant, low-particle, thermal insulation material 22. The insulation material 22 can be a ceramic, a glass ceramic, graphite or graphite foam, including a fibre material, e.g., Carbon Fibre Enforced Carbon (CFC) or graphite felt, or an insulation material containing ceramic fibres, e.g., consisting of $SiO_2$ and $Al_2O_3$ fibres.

A gas guidance device 24 is arranged in a central area of the processing chamber 14. The gas guidance device 24 comprises an upper separating plate 26 and a lower separating plate 28. In addition to the upper and lower separating plate 26, 28, a front and a rear separating plate (not shown) can be provided. Generally, however, the front and rear separating plate are not present, since their function is fulfilled by the thermally insulated chamber side walls, including the doors or vacuum valves arranged there. The upper and lower separating plate 26, 28, and, if appropriate, the front and rear separating plate, are preferably formed from a corrosion-resistant material, such as CFC, from a ceramic material, such as silicon carbide or silicon nitride, or a glass ceramic material.

All separating plates are also cladded with a layer of the forenamed thermal insulation material 22.

The gas guidance device 24 furthermore comprises a first distributor device 30 that is arranged in the area of a first (in FIG. 1 on the left) front side of the gas guidance device 24 between the separating plates 26, 28, and/or a second distributor device 32 that is arranged in the area of a second (in FIG. 1 on the right) front side of the gas guidance device 24 between the separating plates 26, 28. The distributor devices 30, 32 are respectively made of a corrosion-resistant material such as CFC, silicon carbide, silicon nitride, or a glass ceramic material. In the present exemplary embodiment, the distributor devices 30, 32 are in each case a plate equipped with a plurality of vertical slits 33 that are, in particular, aligned with the substrates 12. As an alternative or an addition, the plate, or each plate, can also contain a plurality of holes.

The upper and lower separating plate 26, 28, the first and second distributor device 30, 32, and, if appropriate, also the front and rear separating plate, not shown, form a housing for the substrates 12, which is designed at least approximately with sealed gaps, so that a gas flow 35 that flows through the gas guidance device 24 is guided in the housing and cannot escape from it through the side.

In an upper chamber area 34 located between the upper separating plate 26 and the processing chamber wall 16, a heating device 36 is arranged, for example, a silicon carbide meander heating matrix, while in a lower chamber area 38 located between the lower separating plate 28 and the processing chamber wall 16, a cooling device 40 is arranged, for example, a plate stack cooler or a tube bundle cooler. As an alternative, the cooling device 40 can be arranged in the upper chamber area 34 and the heating device 36 can be arranged in the lower chamber area 38, or the heating and cooling devices can be arranged on top of each other in the upper or lower chamber area (not shown). In the latter case, only one separating plate and one pair of gas deflection elements are required. The separating plate is then arranged between the heating and cooling device, and the gas deflection elements are arranged on the front sides of the separating plate.

In the area of one end (in FIG. 1, the right end) of the heating device 36, a gas inlet device 42 is arranged that extends through the processing chamber wall 16 and makes it possible to feed a processing gas 44 into the processing chamber 14 from outside, in the present exemplary embodiment, a gas comprising an elementary selenium or sulphur vapor. Although the gas inlet device 42 can generally be arranged at any point on the processing chamber 14, the arrangement shown in FIG. 1 is particularly advantageous, since the processing gas 44, which is guided through the gas inlet device 42 during normal operation, first flows through the heating device 36 and is thus heated directly after entering the processing chamber 14. The gas inlet device 42 is connected via a feed line 100 to a source 102 for elementary selenium vapor and to a source 104 for elementary sulphur vapor. The source 102 for elementary selenium vapor and the source 104 for elementary sulphur vapor is respectively assigned to a valve 106 or 108 that is arranged in the feed line 100, which makes it possible to selectively switch on the source 102 for elementary selenium vapor or the source 104 for elementary sulphur vapor, and thus to selectively feed elementary selenium vapor and/or elementary sulphur vapor to the processing chamber 14.

The source 102 for elementary selenium vapor comprises an evacuable source chamber 110, in which a crucible 114 is arranged that is filled with melted selenium mass 112. Furthermore, the source 102 comprises a line 116 for a pre-heated inert carrier gas 118, such as nitrogen or argon. The pre-heating can be regulated in such a manner that the carrier gas temperature does not fall below the crucible temperature.

In the exemplary embodiment shown, the line 116 is arranged in such a manner that the carrier gas 118 is guided through the melted selenium mass 112 according to the bubbler principle. However, alternatively, it would also be possible to arrange the line 116 in such a manner that the carrier gas is guided away over the surface of the melted selenium mass 112. Ultimately, the most important factor in the configuration of the source 102 is the fact that the carrier gas is guided through the source 102 in such a manner that it transports vaporizing elementary selenium vapor from the melted selenium mass 112 into the processing chamber 14.

In order to ensure sufficient vaporization of the elementary selenium from the melted selenium mass 112, i.e., sufficient vapor pressure, the melted selenium mass 112 is maintained at a predetermined selenium source temperature by means of a heating device (not shown). Alternatively, a temperature profile of the source can be run, which enables the selenium partial pressure progression required for the process.

Figure 2:
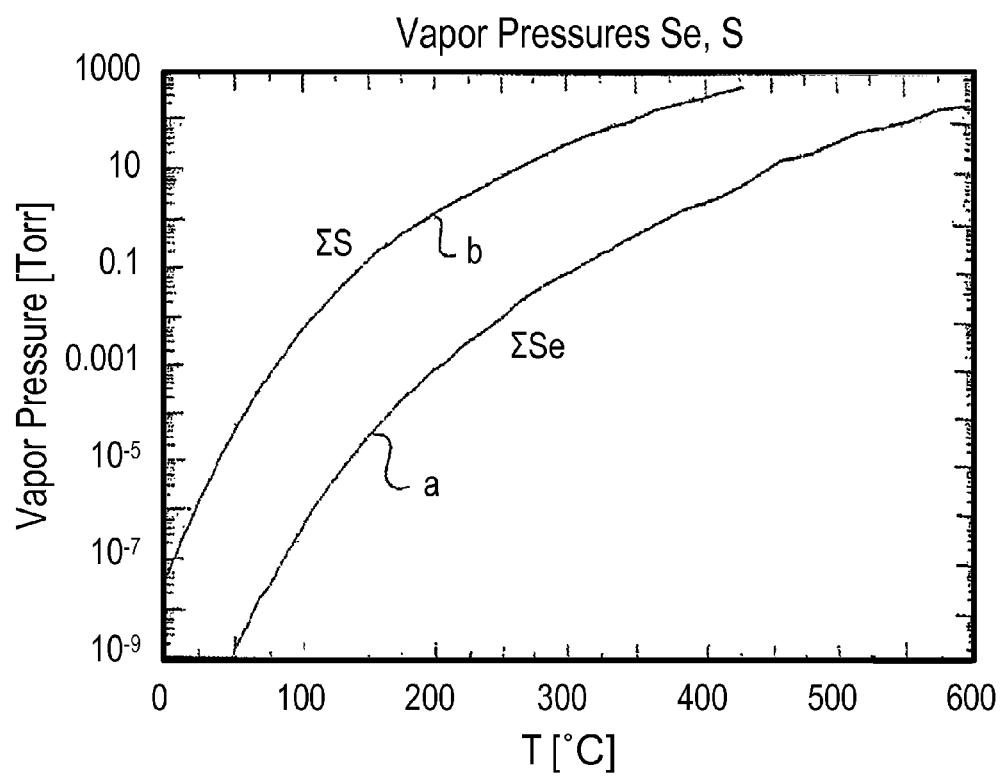
FIG. 2 shows vapor pressure curves of selenium and sulphur as a function of the source temperature.

As can be seen in the selenium vapor pressure curve shown in FIG. 2 (curve a), significant vapor pressures greater than 1 torr (1 torr=1.3 mbar) are only achieved with a selenium source temperature of approximately 360° C. and above. As will be explained in greater detail below, the selenization process can, however, be implemented under rough vacuum ambient pressure or overpressure conditions, e.g., with a processing chamber pressure or total pressure of at least 900 mbar.

With the exemplary embodiment presented, the necessary processing chamber pressure is primarily set by the pressure of the carrier gas 118, which transports the selenium vapor into the processing chamber 14 with a total pressure as the total of the carrier gas pressure and the selenium vapor pressure according to the source temperature. For example, with a total pressure of 900 mbar, the selenium partial pressure can be set to approximately 30 mbar (1 mbar=0.7501 Torr), whereby the selenium crucible temperature is set to approximately 450° C., the carrier gas is set to at least 450° C., and the temperature on the inner surfaces of the processing chamber 14 and, in particular, on the substrates 12 at no point falls below 450° C., in order to prevent selenium condensing out. The essential condition for a reproducible process that can be controlled highly effectively, the avoidance of a condensing out of the processing vapors, can be particularly successfully realized with the chamber arrangement according to the present disclosure when forced convection is used.

The source 104 for elementary sulphur vapor comprises a structure that corresponds to the source 102, i.e., the source 104 also comprises an evacuable source chamber 110', in which a crucible 114' is arranged, which in this case contains melted sulphur mass 120. In the present exemplary embodiment, the source 104 also comprises a line 116' in order to guide pre-heated carrier gas 118, e.g., nitrogen, through the melted sulphur mass 120. As with the source 102, the line 116' of the source 104 can, however, also be arranged in such a manner that the carrier gas is guided away over a surface of the melted sulphur mass 120.

Furthermore, the melted sulphur mass 120 of the source 104 is maintained at a predetermined source temperature by means of a heating device (not shown), in order to ensure sufficient vaporization of elementary sulphur vapor or to ensure sufficient vapor pressure. Alternatively, a temperature profile of the source can also be run here that enables the sulphur partial pressure progression required for the process.

As can be seen in the sulphur vapor pressure curve shown in FIG. 2 (curve b), a vapor pressure of 30 mbar in the case of sulphur is already achieved with a sulphur source temperature of approximately 280° C. and above in contrast to selenium.

In a similar manner as with the source 102 for elementary selenium vapor, it is also the case that with the source 104 for elementary sulphur vapor, according to the exemplary embodiment shown, the necessary processing chamber pressure is primarily set by the pressure of the carrier gas 118 that transports the sulphur vapor into the processing chamber 14 with a total pressure as the total of the carrier gas pressure and the sulphur vapor pressure according to the source temperature.

In order to prevent the elementary selenium or sulphur vapor from condensing on the walls 122, 122' of the source chambers 110, 110', or on the wall of the feed line 100, the source chamber walls 122, 122' and the feed line 100, are respectively maintained at a predetermined temperature by means of a tempering device 124, 124', 126. Here, the temperatures of the gas inlet device 42, the feed line 100 and the source chamber wall 122 should be at least as high as those of the crucible 114 for elementary selenium vapor, and the temperatures of the feed line 100 and the source chamber wall 122' should be at least as high as those of the crucible 114' for elementary sulphur vapor.

Additionally, the crucible 114, the source chamber wall 122, the valve 106, and the line 116 of the source 102 comprise a material that remains stable in selenium, while the crucible 114', the source chamber wall 122', the valve 108, and the line 116' of the source 104 comprise a material that remains stable in sulphur. Accordingly, the feed line 100 and the gas inlet device 42 are also formed of a material that remains stable in selenium and sulphur. The materials that remain stable can, for example, be a ceramic, quartz, a corrosion-resistant special alloy, or a metal or metal alloy coated with a corrosion-resistant layer. The selenium and sulphur source and the feed and discharge lines are equipped with thermally insulating, gas-tight housings (not shown) that prevent selenium and sulphur from escaping should a breakage of the corrosion-resistant material occur. The space between the housing and these corrosion-resistant materials can, e.g., be coated with nitrogen in order to prevent air from entering the processing chamber. In order to monitor a potential leak at the selenium or sulphur source, the nitrogen coating can be pressure monitored.

As is shown in FIG. 1, in the area of the first front side of the gas guidance device 24, at least one first ventilator 46 is upstream of the first distribution device 30 that is driven by a first drive shaft 48 that extends through the processing chamber wall 16. On the opposite side of the gas guidance device 24, two second ventilators 50 are arranged in the area of the second distributor device 32 that are driven by the second drive shafts 52 that extend through the processing chamber wall 16. However, the arrangement can also be designed with ventilators on only one side, e.g., with ventilators 50.

Both the first and second ventilators 46, 50 and the first and second drive shafts 48, 52 are made of a corrosion-resistant material, such as a ceramic material, in particular, silicon nitride or silicon carbide, or a material such as a metal or metal alloy, which is covered with a corrosion-resistant coating. The first ventilators 46 are driven in such a manner that they convey gas into the gas guidance device 24, while the second ventilators 50 are at the same time operated in such a manner that they convey the gas out of the gas guidance device 24. Due to the operation of the ventilators 46, 50, a gas flow circuit is thus generated that, in the view shown in FIG. 1, is oriented in a counter-clockwise direction. In other words, the processing gas 44 is introduced into the processing chamber 14 through the gas inlet device 42 flows from right to left through the heating device 36, then downwards and from left to right through the gas guidance device 24, and then upwards and again from right to left through the heating device 36.

For additional control of the gas flow in the processing chamber 14, an upper pair of reversible gas deflection elements 54 and a lower pair of reversible gas deflection elements 56 are provided. The upper gas deflection elements 54 are arranged in such a manner that they can permit, throttle, or fully prevent the flow of processing gas 44 from the gas guidance device 24 into the upper chamber area 34, or from the upper chamber area 34 into the gas guidance device 24. The lower gas deflection elements 56 are accordingly arranged in such a manner that they can permit, throttle, or fully prevent the flow of processing gas 44 from the gas guidance device 24 into the lower chamber area 38, or from the lower chamber area 38 into the gas guidance device 24.

In the situation shown in FIG. 1, the upper gas deflection elements 54 are in an open position, so that a circulation of the processing gas through the upper area of the processing chamber 14, i.e., through the gas guidance device 24 and the heating device 36, is possible.

The lower gas deflection elements 56 are by contrast in a closed position, i.e., they prevent a circulation of the processing gas 44 through the lower area of the processing chamber 14 and in particular through the cooling device 40. Therefore, in the situation shown in FIG. 1, only hot processing gas is circulating, which contributes to a maintenance of a required processing temperature, e.g., ranging from 400° C. to 600° C. If the upper gas deflection elements 54 are closed, however, and the lower gas deflection elements 56 are opened, the processing gas 44 flows through the cooling device 40, and the substrates 12 are cooled to a reduced temperature, e.g., 250° C.

Figure 4:
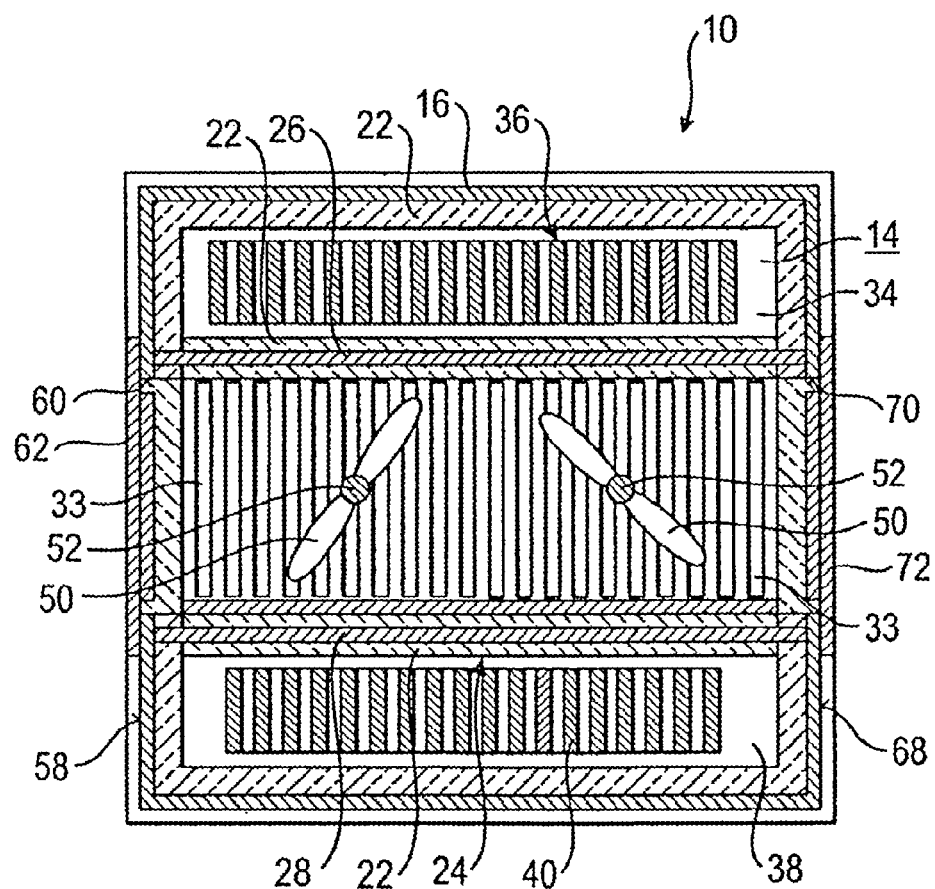
FIG. 4 shows a schematic longitudinal view of the processing device along the line A-A shown in FIG. 1.

In order to load the processing chamber 14, the processing device 10 comprises on its front side a loading opening 60, which is embedded in the processing chamber wall 16, which can be closed by a plate valve 62 or another suitable door (FIG. 4).

The substrates 12 to be processed are arranged in a carrier 64, e.g., on a carriage supported on wheels, vertically oriented and at a distance from each other, in order to form a substrate stack 66, also known as a batch. The substrate stack 66 is conveyed through the loading opening 60 into the processing chamber 14 and is placed in the gas guidance device 24. After the loading opening 60 has been closed, the processing chamber 14 is repeatedly evacuated and rinsed, in order to reduce as far as possible the oxygen and water content in the processing chamber 14.

In order to evacuate the processing chamber 14, the processing chamber wall 16 is equipped with a suitable suction opening (not shown), to which a pump system (also not shown) is connected. In order to rinse the processing chamber 14, a suitable gas inlet is provided in the processing chamber wall 16, through which a rinsing gas, e.g., $N_2$, can be conveyed into the processing chamber 14.

As soon as the atmosphere in the processing chamber 14 comprises a suitable, defined initial state, the ventilators 46, 50 are switched on, the heating device 36 is activated, and nitrogen gas is introduced into the processing chamber 14. The upper gas deflection elements 54 are, at this point in time, open and the lower gas deflection elements 56 are closed, as is shown in FIG. 1, in order to enable heating of the substrates 12. At the same time, the selenium source is maintained at a basic temperature of, e.g., between 150° C. and 300° C. (curve A in FIG. 3).

As soon as the temperature in the processing chamber 14 has reached the required reaction start temperature, e.g., between room temperature and 400° C., and preferably between 150° C. and 300° C., the valve 106 which is assigned to the source 102 for elementary selenium vapor is opened and the elementary selenium vapor that is mixed with the carrier gas 118 is introduced into the processing chamber 14 through the gas inlet device 42 as processing gas 44. Here, the condition is maintained that a selenium condensation is avoided on the substrates. This is achieved due to the fact that the selenium partial pressure in the processing chamber does not exceed the selenium vapor pressure in accordance with the vapor pressure level at the current substrate temperature. Due to a measurement of the carrier gas pressure and the carrier gas temperature in the processing chamber before introducing the selenium vapor and due to knowledge of the processing chamber volume and measurement of the substrate temperature, the carrier gas flow through the selenium source and the selenium crucible temperature, the selenium partial pressure in the chamber can be determined, e.g., by means of a computer, and transferred to the regulation device for the selenium source. This device then adjusts the flow of carrier gas 118, the crucible, source wall and feed and discharge tube temperatures, taking into account the vapor pressure curve. A sufficient condition for avoiding selenium condensation is, e.g., that the selenium source temperature (curve A in FIG. 3) is not greater than the temperature in the processing chamber 14, and, in particular, is not greater than a minimum substrate temperature (curve B in FIG. 3).

In order to influence the strip distance of the I-III-VI connecting semiconductor in a targeted manner, and as a result, to increase the efficiency of the solar module, in this phase, sulphur can already be fed to the selenium flow by switching on the sulphur source in such a manner that preferably, a partial pressure ratio of sulphur to selenium of greater than 0 and up to 0.9, preferably ranging from 0.1 to 0.3, is created. Here, the sulphur source is regulated in the same manner as the regulation of the selenium source described above. After the processing gas 44 has flowed away over the substrates 12 for a specific time period, at a processing chamber pressure in the range of, e.g., 100 mbar to ambient pressure, preferably between 700 mbar and 950 mbar, at a required temperature profile (FIG. 3), a required gas flow speed and at the required selenium or sulphur partial pressures, e.g., ranging from 0.001 mbar to 100 mbar, the feed of elementary selenium and sulphur vapor is stopped, if necessary, the ventilators 46, 50 are shut down, and the processing chamber 14 is evacuated and/or rinsed at least once. Alternatively, only the feed of selenium vapor can be stopped. During this process, the selenium source temperature is reduced back to its initial temperature of, e.g., 150° C. to 300° C.

Figure 3:
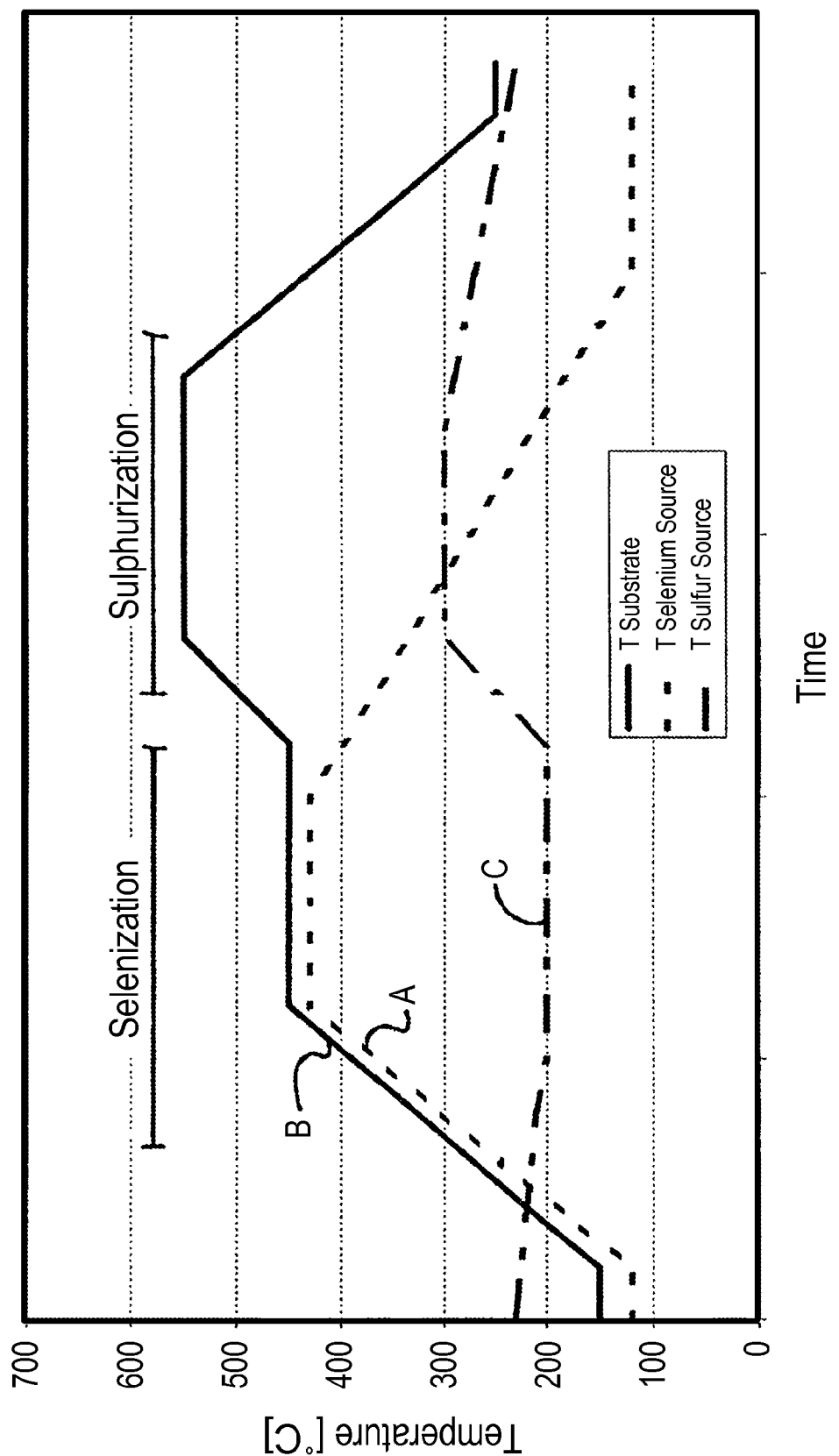
FIG. 3 shows the time progression of the substrate temperature and the source temperature during a method implemented in the device shown in FIG. 1 for producing a chalcopyrite semiconductor.

The valve 108 that is assigned to the source 104 for elementary sulphur vapor is opened, and the elementary sulphur vapor that is mixed with the carrier gas 118 is conveyed into the processing chamber 14 as processing gas through the gas inlet device 42. In alternative operating mode, the valve 108 remains open. At the same time, the ventilators 46, 50 are switched back on, if they have previously been shut down. The processing temperature is further increased, e.g., to between 400° C. and 600° C., and is maintained at a set temperature for a specific time period (FIG. 3).

With a processing chamber pressure in the rough vacuum, ambient pressure, or overpressure range, the required gas flow speed and sulphur concentration is regulated, with the latter ranging, e.g., from 0.01 mbar to 100 mbar.

With this processing stage, the condition is also maintained that the sulphur partial pressure in the processing chamber does not exceed the sulphur vapor pressure with the corresponding substrate temperature, in order to avoid sulphur condensation. The regulations and measures given in the description for the selenium source also apply here. Here also, a sufficient measure that the sulphur source temperature (curve C in FIG. 3) is not greater than the temperature in the processing chamber 14, and in particular is not greater than a minimum substrate temperature (curve B in FIG. 3). The sulphur source temperature is for this purpose maintained or adjusted, e.g., in the temperature range of between 100° C. and 450° C., preferably between 150° C. and 350° C.

After the heating procedure has been completed, the upper gas deflection elements 54 are brought into their closed position, and the lower gas deflection elements 56 are opened, so that the processing gas 44 is now guided through the cooling device 40 and the substrates 12 are cooled to a temperature, e.g., ranging from 350° C. to 150° C., such as 250° C.

After renewed pumping of the processing chamber 14 and filling with nitrogen, the processing of the substrate stack 66 is completed so that it can be removed from the processing chamber 14.

The heating and cooling rates, which can be achieved with the processing device 10 and which can be set in a broad range—e.g., from 5° C./min to 600° C./min—make it possible to implement the processing of the substrate stack 66 in the processing chamber 14, i.e., in the present exemplary embodiment, to selenize and sulphurize the metal-coated glass substrates 12 in less than 2 hours.

In general, it is possible to remove the processing goods stack 66 through the loading opening 60 on the front side 58 of the processing device 10.

In the present exemplary embodiment, the processing device 10 comprises on its rear side 68 a discharge opening 70 that is embedded in the processing chamber wall 16 and in a similar manner to the loading opening 60 can be closed by a plate valve 72 or another suitable door (FIG. 4). The equipment of the processing device 10 with a loading opening 60 and a discharge opening 70, which is located opposite, has the advantage that the processing device 10 is used as a through-flow device and can be coupled with additional processing devices.

Figure 5:
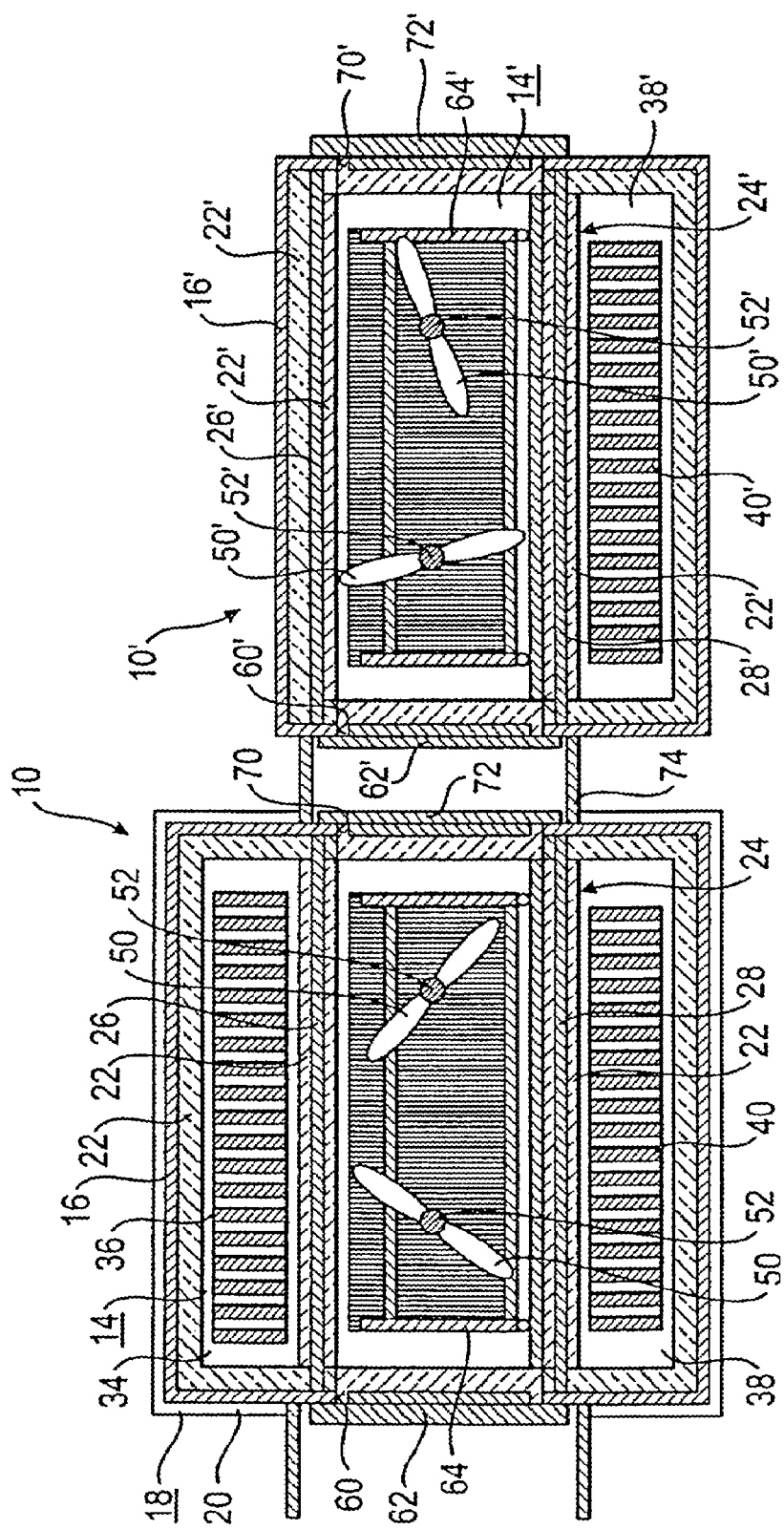
FIG. 5 shows a schematic longitudinal view of a processing plant with a processing device of the type shown in FIG. 1 and a cooling device shown adjacent to it.

FIG. 5 shows a processing plant, for example, that comprises a processing device 10 and a cooling device 10' that is connected on the outlet side. The cooling device 10' is designed in a similar manner to the processing device 10, with the single difference that the upper chamber area 34 does not have the heating device 36 arranged inside it. Since the cooling device 10' is solely provided to cool the glass substrates 12, and a cooling gas, in particular an inert gas such as nitrogen gas, is solely designed to flow through the gas guidance device 24' and the lower chamber area 38' which comprises the cooling device 40', the upper and lower gas deflection elements 54, 46 are also not present. For the purpose of greater clarity, no second distributor devices 32 are shown.

The cooling device 10' is coupled via a connection section 74 to the processing device 10 and is arranged next to said device in such a manner that a loading opening 60' of the cooling device 10' is aligned with the discharge opening 70 of the processing device 10. The loading opening 60' of the cooling device 10' can be opened and closed at the same time by a plate valve 62' with or independently of the discharge opening 70 of the processing device 10.

Due to the arrangement of the processing device 10 and the cooling device 10' in series, it is possible to move the processing goods stack 66 after processing has been completed in the processing device 10 through the discharge opening 70 and the discharge opening 60' in the cooling device 74. The sluicing out of the processing goods stack 66 from the processing device 10 into the cooling device 74 can, for example, be conducted at a temperature ranging from 400° C. to 200° C., particularly from 300° C. to 250° C.

After the processing goods stack 66 has been conveyed into the cooling device 10', the plate valve 72 is again closed and the processing device 10 is fed a new processing goods stack 66.

At the same time, the first processing goods stack 66, which is now located in the cooling device 10', can be further cooled, e.g., to 80° C., wherein by actuating the ventilators 50', circulating nitrogen gas is guided past on the glass substrates 12 and through the cooling device 40'. After a final evacuation and final filling of the cooling device 10', the processing goods stack 66 can be removed from the cooling device 10' through a discharge opening 70'. The cooling device 10' is now ready for retention of the next processing goods stack 66 from the processing device 10.

Figure 6:
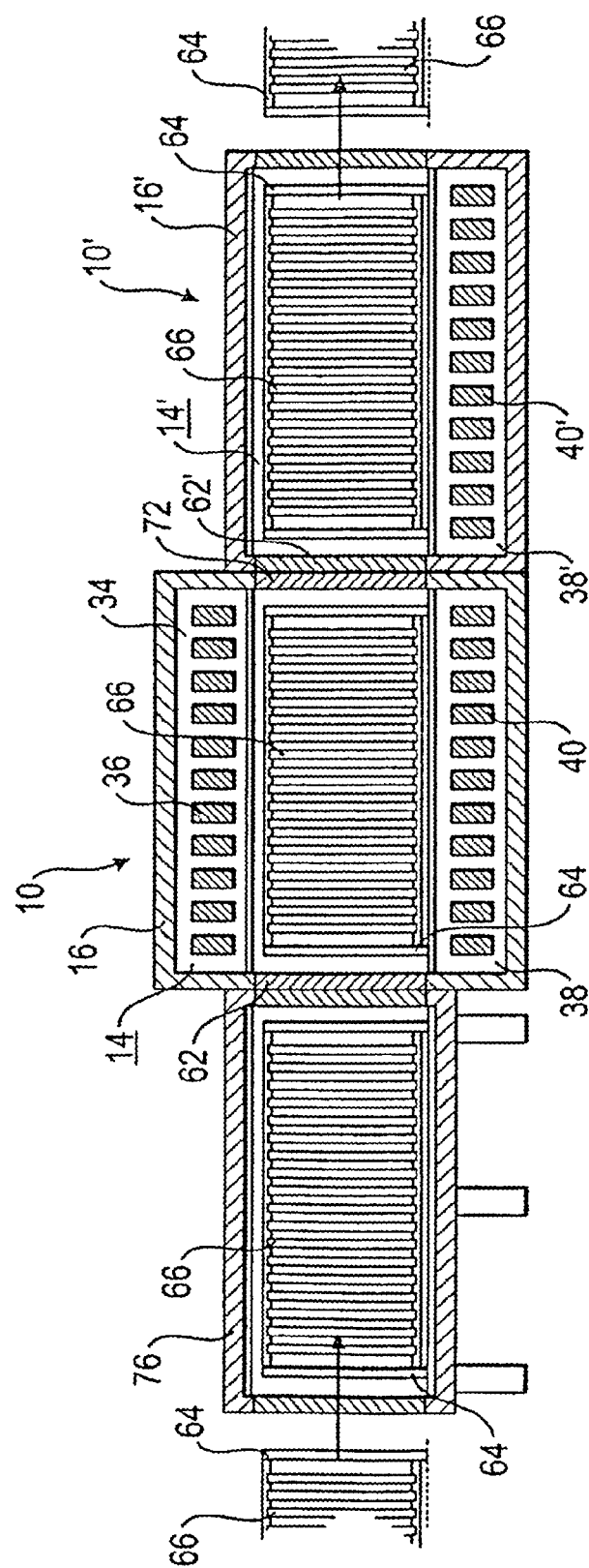
FIG. 6 shows a schematic longitudinal view of an alternative embodiment of a processing plant with a sluice chamber upstream of the processing device and a cooling device downstream of the processing device.

As is shown in FIG. 6, a sluice chamber 76 can be upstream of the processing device 10, which prevents ambient atmosphere from entering the processing chamber 14 during loading of the processing device 10 with a processing goods stack 66. In the sluice chamber 76, the processing goods stack 66 can be pre-heated from room temperature to a temperature ranging from 100° C. to 200° C., e.g., approximately 150° C.

Furthermore, a transport mechanism for moving the carrier 64, which supports the processing goods stack 66 through the processing plant, can comprise an insertion mechanics system for inserting the carrier 64 and processing goods stack 66 from the sluice chamber 76 into the processing chamber 14, and a withdrawal mechanics system for withdrawing the carrier 64 and processing goods stack 66 from the processing chamber 14 into the cooling device 10'. In this manner, the moved parts of the transport mechanism can be prevented from coming into contact with the hot and corrosive areas of the processing plant.

Figure 7:
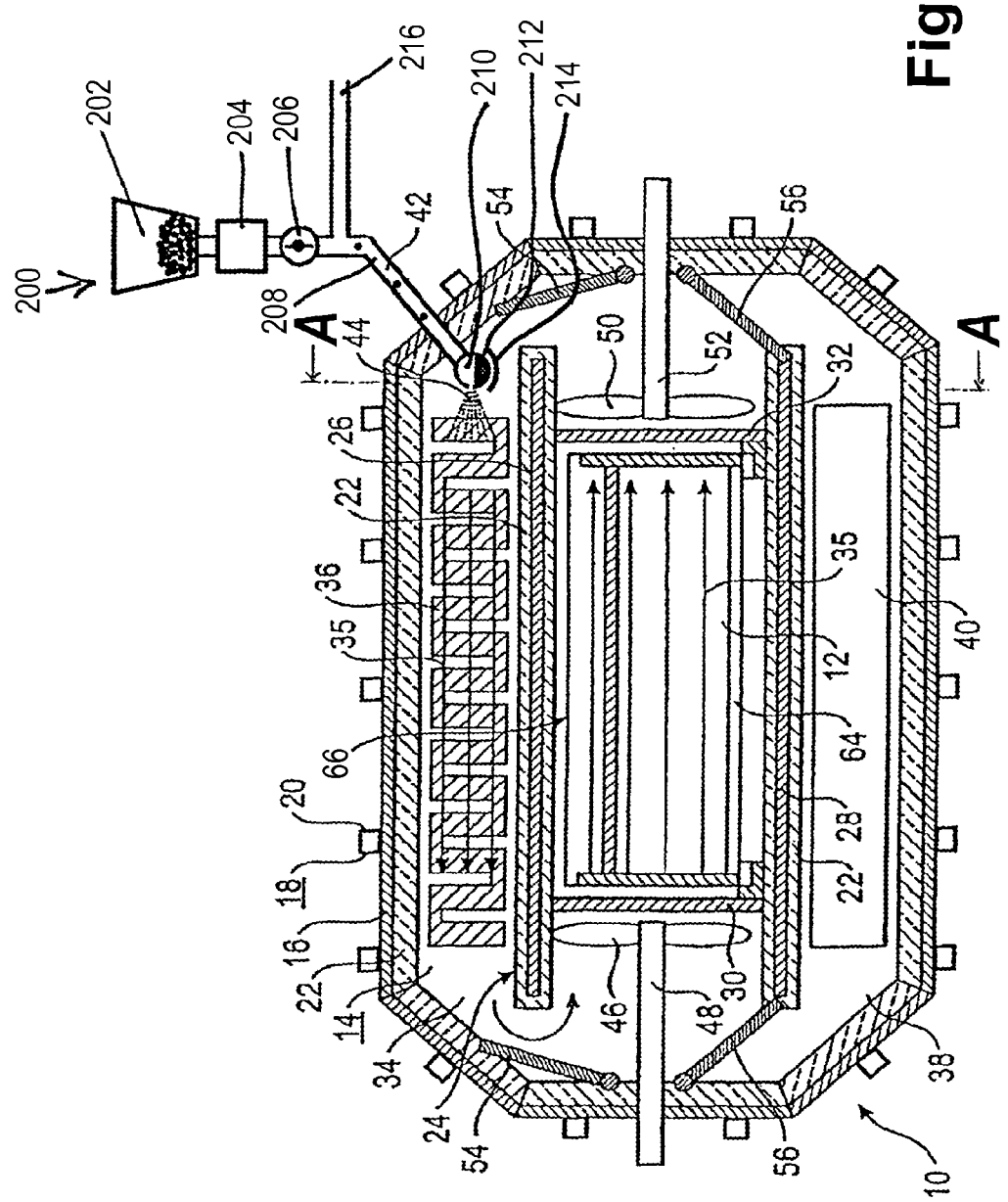
FIG. 7 shows a schematic view of an alternative embodiment of a processing device according to the present disclosure.

FIG. 7 shows an alternative embodiment of a processing device 10 according to the present disclosure, which is, e.g., provided for the formation of Cu(In, Ga)(Se, S)$_2$ semiconductor layers on substrates 12, which are to be used for the production of solar cells.

The processing device 10 comprises an evacuable processing chamber 14 that is limited by a processing chamber wall 16. The processing chamber wall 16 is formed from stainless steel and is maintained by a tempering device, which can be designed in a similar manner to the processing device shown in FIG. 1, at a temperature ranging from 150° C. to 250° C. Accordingly, this can be a tube line system, which is attached to the outer side of the processing chamber 14, and, in particular, welded to the processing chamber wall 16 and encircles the processing chamber 14 in a meander form, through which, e.g., a suitable hot oil flows. As an alternative or additionally, the hot oil can, however, also flow through channels (not shown) that are accordingly embedded into the processing wall 16. Additionally, the outer side of the processing chamber wall 16 can be equipped with a thermally insulating material.

On an inner side of the processing chamber wall 16, the processing chamber 14 is at least approximately completely cladded with a corrosion-resistant, low-particle, thermal insulation material 22. The insulation material 22 can be a ceramic, a glass ceramic, graphite or graphite foam, including a fibre material, e.g., Carbon Fibre Enforced Carbon (CFC) or graphite felt, or an insulation material containing ceramic fibres, e.g., consisting of $SiO_2$ and $Al_2O_3$ fibres.

A gas guidance device 24 is arranged in a central area of the processing chamber 14. The gas guidance device 24 comprises an upper separating plate 26 and a lower separating plate 28. In addition to the upper and lower separating plate 26, 28, a front and a rear separating plate (not shown) can be provided. Generally, however, the front and rear separating plate are not present, since their function is fulfilled by the thermally insulated chamber side walls, including the doors or vacuum valves arranged there. The upper and lower separating plate 26, 28 and, if appropriate, the front and rear separating plate, are preferably formed from a corrosion-resistant material, such as CFC, from a ceramic material, such as silicon carbide or silicon nitride, or a glass ceramic material.

All separating plates are also cladded with a layer of the forenamed thermal insulation material 22.

The gas guidance device 24 furthermore comprises a first distributor device 30, which is arranged in the area of a first (in FIG. 1 on the left) front side of the gas guidance device 24 between the separating plates 26, 28, and/or a second distributor device 32, which is arranged in the area of a second (in FIG. 1 on the right) front side of the gas guidance device 24 between the separating plates 26, 28. The distributor devices 30, 32 are respectively made of a corrosion-resistant material such as CFC, silicon carbide, silicon nitride, or a glass ceramic material. In the present exemplary embodiment, the distributor devices 30, 32 are in each case a plate, which is equipped with a plurality of vertical slits 33, which are, in particular, aligned with the substrates 12. As an alternative or an addition, the plate, or each plate, can also contain a plurality of holes.

The alternative embodiment 10 according to FIG. 7 furthermore contains a second feed line 208, e.g., for selenium or sulphur, and if appropriate, a third feed line for sulphur or selenium (not shown) as a component of a transfer device 200, via which selenium and/or sulphur first enter the processing chamber 14 in solid form. The third feed line, respectively, is then a regular component of a separate supply and dosing unit. Here, solid selenium or solid sulphur can be stored, preferably under inert gas conditions, in the solid materials supply 202. Via the dosing device 204, solid selenium or solid sulphur can be transferred via the second feed line 208 by actuating the valve 206 into a vaporization unit 210 located inside the processing chamber 14. In other words, the valve is also integrated into the feed line to the processing chamber. The inert gas feed line 216 opens out upstream of this valve 206. If the selenium or sulphur are present in melted form in the crucible 210, according to a method variant, the valve 206 can be closed and the inert gas feed can be increased via the feed line 216. In this manner, the quantity of elementary selenium or sulphur vapor from the shuttle or crucible 210 can be adjusted or increased. The solid material that is introduced in this manner can, for example, be converted with the aid of a heating element 214 that is arranged below the crucible/shuttle into fluid and gaseous selenium or gaseous sulphur vapor, which can then be fed via a gas distributor into the processing chamber 14 as elementary selenium or sulphur vapor 44. In order to ensure that the entire transfer process takes place under inert conditions, inert gas can be introduced into the second feed line 208 via a feed line 216. This inert gas flow can be used to deliver selenium or sulphur vapor from the vaporization unit 10 in a particularly effective manner.

The method according to the present disclosure can be implemented in a particularly secure manner using the processing device shown in FIG. 7. Additionally, the procedure made possible by this device has the advantage that solid selenium or solid sulphur can be dosed in a highly precise manner. It is no longer necessary to open the processing device for the introduction of solid selenium or sulphur, and an external vaporization source and the entailing apparatus costs are no longer required.

Figure 8:
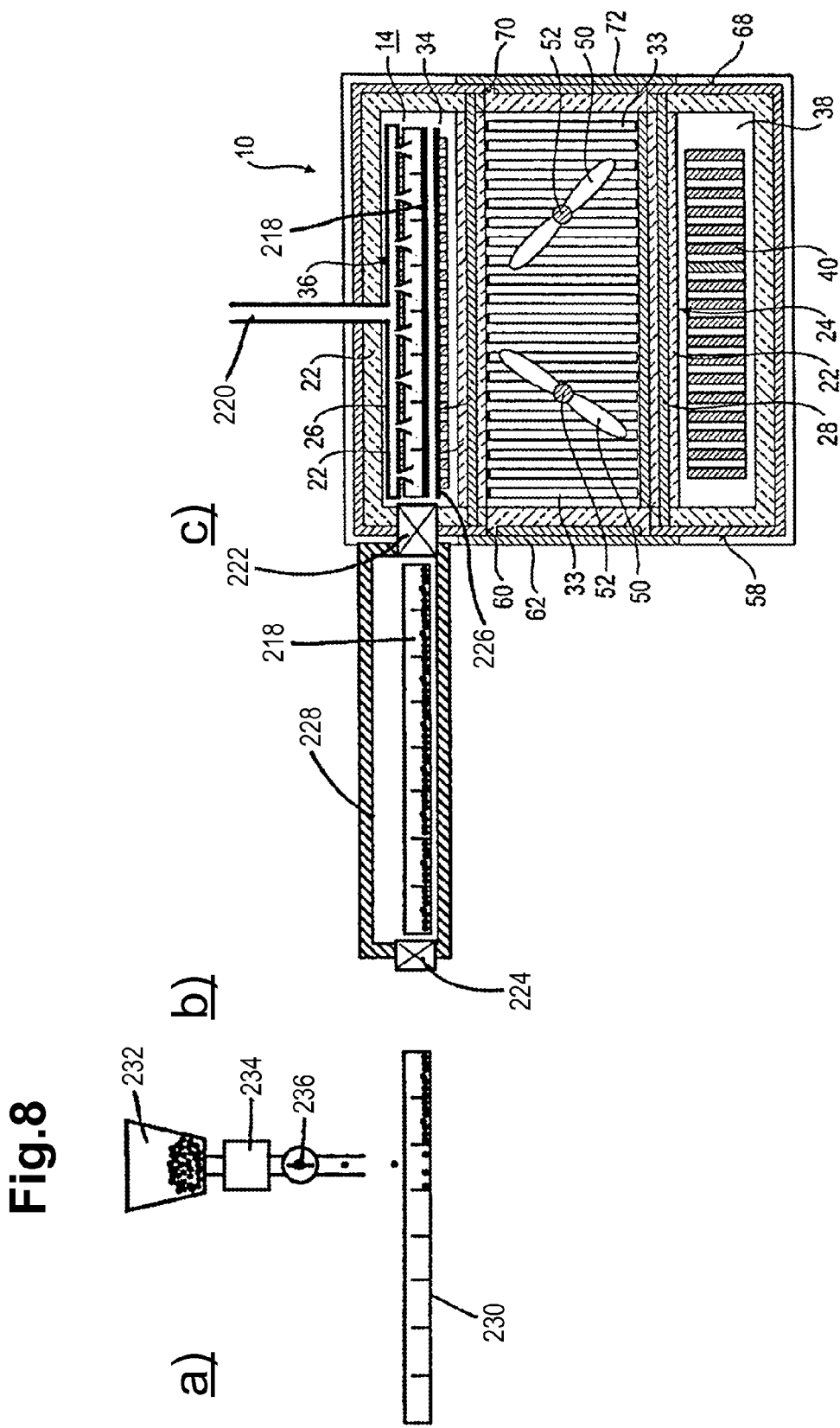
FIG. 8 shows a schematic view of a further alternative embodiment of a processing device according to the present disclosure.

Instead of introducing the sulphur or selenium in solid form into the processing chamber via a feed line, or in a shuttle or crucible present in the processing chamber, according to a further embodiment shown in FIG. 8, a processing device 10 can be provided in which one or more shuttles filled with solid selenium or solid sulphur, if appropriate, also filled with fluid selenium or fluid sulphur, are inserted into the processing chamber 14 via a transfer station or transfer or sluice chamber 228. This advantageously occurs under inert gas conditions using the vacuum feeders 222 and 224. In this embodiment, the transfer or sluice chamber 228 is docked onto the processing chamber 14. In the variant shown, a shuttle module 230 containing a plurality of shuttles/crucibles 218 with selenium or sulphur pellets is filled via an external dosing device 234 from a corresponding supply 232 with the aid of a valve 236 (see FIG. 8a). The filling stage of the shuttle module 230 can already be implemented under inert conditions in a simple manner. The filled shuttle module 230 is introduced into the transfer or sluice chamber 228 via the vacuum feeder 224 (FIG. 8b). The shuttle module 230 can be prepared in the transfer or sluice chamber 228 for introduction into the processing chamber 14 via the vacuum feeder 222 by multiple evacuation and rinsing with inert gas. In the processing chamber 14, the selenium or sulphur present in the individual shuttles 218 in solid form can be converted into a fluid state using the heating unit 226 (FIG. 8c). Via the inert gas feed line 220, inert gas enters the respective shuttles 218 and forces the distribution of elementary sulphur or selenium vapor inside the processing chamber. The feed device 220 can be designed in the form of a gas chamber, containing a plurality of injection nozzles, for example. Alternatively or additionally, the elementary selenium or sulphur vapor can be discharged from the respective shuttle 218 by the ventilators 50 and distributed in the processing chamber 14. Furthermore, it is possible to go without the heating unit 226, since the heating device of the substrate in the processing chamber 14 ensures corresponding processing temperatures that lead to a fluidization of the selenium or sulphur. As a rule, the shuttle module 230 is retained in the processing chamber 14 until all sulphur or all selenium has been vaporized. The shuttle module 230 can then be further conveyed out via the transfer or sluice chamber 228 and re-filled.

Figure 9:
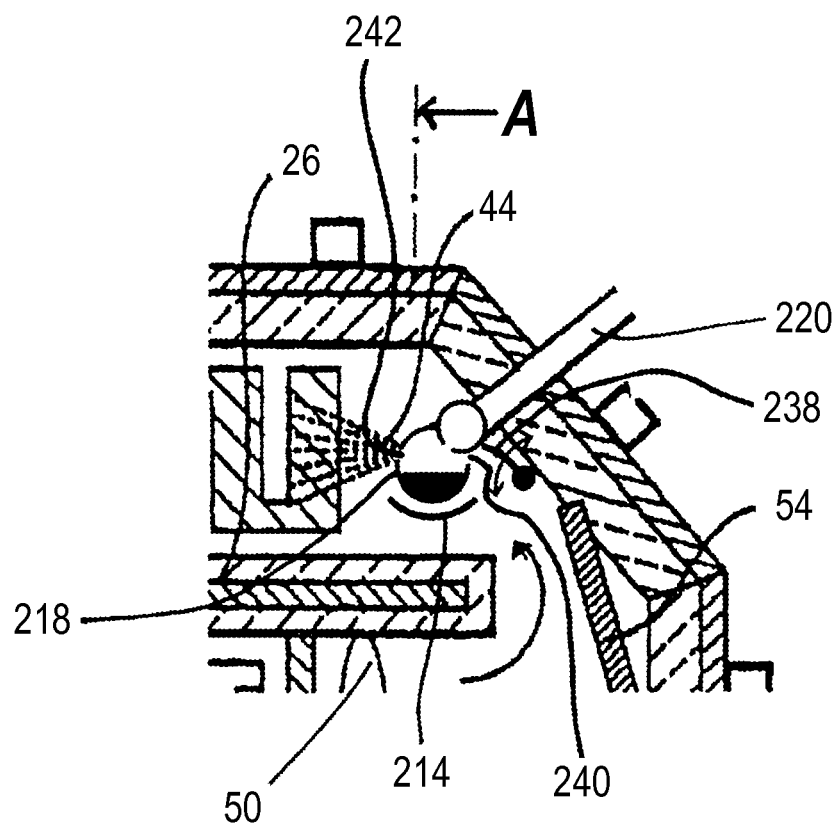
FIG. 9 shows a detailed view of a section of the device according to the present disclosure shown in FIG. 8 in a schematic transverse view.

FIG. 9 shows a further development of the embodiment of a processing device 10 as shown in FIG. 8. Inert gas is fed into each shuttle via the inert gas feed line 220. As a result, the selenium or sulphur which has been liquidized via the heating unit 214, is discharged from the outlet nozzle 242 in elementary vapor form. Alternatively or additionally, the flow generated via the ventilators 50 can be used to transfer fluidized selenium or fluidized sulphur into the processing chamber. This is achieved particularly effectively when a flow deflection device, which can, in particular, be pivoted or changed in its position, is provided, in particular, in the form of a flow flap valve 238, with the aid of which the gas flow in the processing chamber generated by the ventilators 50 is guided in a targeted manner over the surface of the fluidized selenium or sulphur. In the embodiment shown in FIG. 9, the flow flap valve 238 guides the inert gas flow via the inlet opening 240 over the fluid selenium or sulphur surface, so that via the outlet opening or nozzle 242, elementary sulphur or elementary selenium can be discharged in vapor form. Insofar as is necessary, the deflection plates 54 can also be used to guide the gas flow over the fluid selenium or sulphur samples in the crucibles 218.

The features of the present disclosure disclosed in the present description, in the claims, and in the drawings, can be essential both individually and in any combination for the realization of the present disclosure in its different embodiments.

LIST OF REFERENCE NUMERALS

10 Processing device
12 Substrate
14 Processing chamber
16 Processing chamber wall
18 Tempering device
20 Tube line
22 Thermal insulation material
24 Gas guidance device
26 Upper separating plate
28 Lower separating plate
30 First distributor device
32 Second distributor device
33 Slit
34 Upper chamber area
35 Gas flow
36 Heating device
38 Lower chamber area
40 Cooling device
42 Gas inlet device
44 Processing gas
46 First ventilator
48 First drive shaft
50 Second ventilator
52 Second drive shaft
54 Upper gas deflection element
56 Lower gas deflection element
60 Loading opening
62 Plate valve
64 Carrier
66 Processing goods stack
68 Rear side
70 Discharge opening
72 Plate valve
74 Connection section
76 Sluice chamber
100 Feed line
102 Source for elementary selenium vapor
104 Source for elementary sulphur vapor
106 Valve
108 Valve
110 Source chamber
112 Melted selenium mass
114 Crucible
116 Line
118 Carrier gas
120 Melted sulphur mass
122 Source chamber wall
124 Tempering device
126 Tempering device
200 Transfer device
202 Solid material supply
204 Dosing device
206 Valve
208 Feed line
210 Vaporization unit
214 Heating element
216 Feed line
218 Shuttle/crucible containing selenium or sulphur
220 Inert gas feed line
222 Vacuum feeder
224 Vacuum feeder
226 Heater for Vaporization unit
228 Transfer chamber
230 Shuttle module
232 Selenium or sulphur solid material supply
234 Dosing unit
236 Valve
238 Flow flap valve
240 Flow inlet
242 Flow outlet nozzle

The invention claimed is:
1. A processing device for producing semiconductor layers and coated substrates treated with elemental selenium and/or sulphur, comprising:

an evacuable processing chamber for receiving at least one substrate to be processed, wherein the substrate to be processed has at least one metal layer and/or at least one layer containing metal;

a heating device for convective heating of the substrate to be processed to a predetermined substrate temperature;

a first source of elementary selenium and/or sulphur vapor located outside the processing chamber and connected to the processing chamber via a first feed line and/or a second source of elementary selenium and/or sulphur vapor located inside the processing chamber, wherein the elementary selenium and/or sulphur vapor is guided past the metal layer and/or layer containing metal, under rough vacuum conditions or ambient pressure conditions or overpressure conditions, in order to chemically react said layer with selenium or sulphur in a controlled manner; and a gas conveying device for generating a gas flow circuit by way of forced convection in the processing chamber, wherein the substrate is heated by way of the forced convection, and wherein the elementary selenium and/or sulphur vapor is mixed and guided past the substrate by way of the forced convection;

wherein the heating device is arranged in the gas flow circuit generated by the gas conveying device in order to heat the elementary selenium and/or sulphur vapor in the processing chamber.

2. The processing device according to claim 1, wherein the gas conveying device comprises an injection nozzle or a ventilator.

3. The processing device according to claim 1, wherein the gas conveying device is arranged in an area of a front side of a stack of substrates in the processing chamber.

4. The processing device according to claim 1, further comprising a tempering device that maintains at least one partial section of a wall that defines the processing chamber and at least one section of the first feed line at a predetermined temperature.

5. The processing device according to claim 1, wherein the first source comprises a heatable and evacuable source chamber in which a crucible filled with melted selenium or sulphur mass is arranged, the device further comprising a line for pre-heated carrier gas such that the carrier gas is either guided through the melted selenium or sulphur mass according to a bubbler principle, or is guided away from the melted selenium or sulphur mass, wherein the crucible and the line comprise material that remains stable in selenium or sulphur, and are formed from ceramic, quartz, or corrosion-resistant special alloys or metals with corrosion-resistant coatings.

6. The processing device according to claim 1, wherein the heating device is arranged in the gas flow circuit generated by the gas conveying device in order to heat a gas located in the processing chamber; and/or wherein a cooling device for cooling down a gas located in the processing chamber is arranged in the gas flow circuit generated by the gas conveying device; and/or gas diversion elements are provided through which the gas flow circuit can be diverted in such a manner that either the heating device or the cooling device is arranged in the gas flow circuit.

7. The processing device according to claim 1, further comprising at least one device for pre-dosing of solid selenium and/or solid sulphur outside the processing chamber, and/or at least one transfer device for transferring solid selenium and/or solid sulphur into the processing chamber.

8. The processing device according to claim 7, wherein the transfer device comprises a second feed line and/or a sluice chamber containing a retaining device for solid selenium or solid sulphur.

9. The processing device according to claim 1, further comprising at least one flow deflection device that can be pivoted or changed in its position, wherein the flow deflection device is a flow flap valve for targeted guidance of the inert gas over the surface of fluid or fluidized selenium and/or fluid or fluidized sulphur located in the processing chamber.

10. A processing plant for processing stacked substrates with at least one processing device according to claim 1, wherein the processing device comprises a loading opening through which a substrate stack can be inserted into the processing chamber, and a discharge opening through which the substrate stack can be removed from the processing chamber.

11. The processing device according to claim 1, wherein the evacuable processing chamber is configured to receive a stack of substrates, each of which having at least one metal layer or at least one layer containing metal.

12. The processing device according to claim 3, wherein the gas conveying device is a ventilator.

13. The processing device according to claim 4, wherein the tempering device is configured to maintain at the predetermined temperature the entire wall that defines the processing chamber.

14. The processing device according to claim 9, wherein the flow flap is configured for targeted guidance of the inert gas in a retaining device over the surface of the fluid or fluidized selenium and/or the fluid or fluidized sulphur located in the processing chamber.

15. The processing device according to claim 1, wherein an inner side of the processing chamber has a thermal insulation material that is resistant under processing conditions.

16. The processing device according to claim 1, wherein the elementary selenium and/or sulphur vapor is mixed and guided past the substrate by way of the forced convection in a homogeneous manner.

17. A processing device for producing semiconductor layers and coated substrates treated with elemental selenium and/or sulphur, comprising:

an evacuable processing chamber for receiving at least one substrate to be processed, wherein the substrate to be processed has at least one metal layer and/or at least one layer containing metal;

a heating device for convective heating of the substrate to be processed to a predetermined substrate temperature;

a first source of elementary selenium and/or sulphur vapor located outside the processing chamber and connected to the processing chamber via a first feed line and/or a second source of elementary selenium and/or sulphur vapor located inside the processing chamber, wherein the elementary selenium and/or sulphur vapor is guided past the metal layer and/or layer containing metal, under rough vacuum conditions or ambient pressure conditions or overpressure conditions, in order to chemically react said layer with selenium or sulphur in a controlled manner; and a gas conveying device for generating a gas flow circuit by way of forced convection in the processing chamber, wherein the substrate is heated by way of the forced convection, and wherein the elementary selenium and/or sulphur vapor is mixed and guided past the substrate by way of the forced convection, wherein the processing device comprises a loading opening through which a substrate stack can be inserted into the processing chamber, and a discharge opening through which the substrate stack can be removed from the processing chamber.

* * * * *